US012622138B2

(12) United States Patent
Shin et al.

(10) Patent No.: US 12,622,138 B2
(45) Date of Patent: May 5, 2026

(54) DISPLAY DEVICE

(71) Applicant: Samsung Display Co., LTD., Yongin-si (KR)

(72) Inventors: Dong Hee Shin, Yongin-si (KR); Sang Yong No, Yongin-si (KR); Sun Kwun Son, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 354 days.

(21) Appl. No.: 18/450,550

(22) Filed: Aug. 16, 2023

(65) Prior Publication Data

US 2024/0121993 A1     Apr. 11, 2024

(30) Foreign Application Priority Data

Oct. 11, 2022   (KR) ........................ 10-2022-0130100
Mar. 13, 2023   (KR) ........................ 10-2023-0032769

(51) Int. Cl.
*H10K 59/122*     (2023.01)
*H10K 59/121*     (2023.01)
*H10K 59/123*     (2023.01)
*H10K 59/131*     (2023.01)

(52) U.S. Cl.
CPC ....... *H10K 59/122* (2023.02); *H10K 59/1213* (2023.02); *H10K 59/123* (2023.02); *H10K 59/1315* (2023.02)

(58) Field of Classification Search
CPC ............. H10K 59/122; H10K 59/1213; H10K 59/123; H10K 59/1315; H10K 59/86
See application file for complete search history.

(56) References Cited

U.S. PATENT DOCUMENTS

2006/0108914 A1    5/2006   Young
2008/0197778 A1    8/2008   Kubota
2008/0218061 A1    9/2008   Chao et al.
2014/0197385 A1    7/2014   Madigan
(Continued)

FOREIGN PATENT DOCUMENTS

CN     101859876     10/2010
EP     3 506 361     7/2019
(Continued)

OTHER PUBLICATIONS

Extended European Search Report for European Patent Application No. 23202758.1, dated Feb. 26, 2024.

*Primary Examiner* — Pegeman Karimi

(57)     ABSTRACT

A display device includes a pixel circuit on a substrate and including a transistor, a first pixel electrode on the pixel circuit and electrically connected to the pixel circuit, a bank on the first pixel electrode and including first, second, third, and fourth open parts, a first contact electrode on the bank and the first and second open parts and in contact with the first pixel electrode through the first open part, a second pixel electrode overlapping the second and third open parts, the second pixel electrode and the first pixel electrode formed as a same layer, a second contact electrode on the bank and the third and fourth open parts and in contact with the second pixel electrode through the third open part, and a common pixel electrode overlapping the fourth open part, the common pixel electrode and the second pixel electrode formed as a same layer.

20 Claims, 21 Drawing Sheets

MTL1 : VDL, VVSL
ACTL : DE1, ACT1, SE1
MTL2 : GE1, AUE1, AUE3
MTL3 : CE1, AUE2, AUE4
MTL4 : CPX, PXR1, PXR2
MTL5 : CTR1, CTR2, CCT
SP1 : ED1, ED2

(56) References Cited

U.S. PATENT DOCUMENTS

| | | | | |
|---|---|---|---|---|
| 2015/0364712 | A1 | 12/2015 | Lee et al. | |
| 2021/0359049 | A1* | 11/2021 | Heo | H10H 20/857 |
| 2022/0115470 | A1* | 4/2022 | Kim | H10K 59/122 |
| 2022/0157917 | A1* | 5/2022 | Park | H10K 59/122 |
| 2022/0173341 | A1* | 6/2022 | Bok | H10K 59/878 |

FOREIGN PATENT DOCUMENTS

| | | |
|---|---|---|
| KR | 10-2017-0052766 | 5/2017 |
| KR | 10-2395388 | 5/2022 |

* cited by examiner

MTL1: VDL, CPE2, DL1
ACTL: DE1, ACT1, SE1, DE2, ACT2, SE2
MTL2: AUE1, GE1, CPE1, GE2
MTL3: AUE2, CE1, CE2, CE3

MTL1 : VDL
ACTL : DE1, ACT1,SE1
MTL2 : GE1, AUE1
MTL3 : CE1, AUE2
MTL4 : CPX, PXG1, PXG2
MTL5 : CTG1, CTG2, CCT
SP2 : ED1, ED2

MTL1 : VDL
ACTL : DE1, ACT1,SE1
MTL2 : GE1, AUE1
MTL3 : CE1, AUE2
MTL4 : CPX, PXB1, PXB2
MTL5 : CTB1, CTB2, CCT
SP3 : ED1, ED2

SP2

ED2    ED1

ED2    ED1
SP1

ED1    ED2
SP3

Y

X

Z

MTL1 : VDL, VVSL
ACTL : DE1, ACT1,SE1
MTL2 : GE1, AUE1, AUE3
MTL3 : CE1, AUE2, AUE4
MTL4 : PXR1, PXR2, CPX
MTL5 : CTR, CCT
SP1 : ED1, ED2

SP : SP1, SP2, SP3
VDDL : VDDL1, VDDL2
VSSL : VSSL1, VSSL2
VIL : VIL1, VIL2
DL : DL1, DL2, DL3

MTL1: CPE2, DL1
ACTL: DE5, ACT5, SE5, DE1, ACT1, SE2, ACT2, DE2
MTL2: GE5, GE1, CPE1, GE2
MTL3: CCE, CE1, CE2, CE3

DISPLAY DEVICE

CROSS-REFERENCE TO RELATED APPLICATION(S)

This application claims priority to and benefits of Korean Patent Application No. 10-2022-0130100 filed on Oct. 11, 2022, and No. 10-2023-0032769 filed on Mar. 13, 2023, under 35 U.S.C. § 119, in the Korean Intellectual Property Office, the entire contents of which are incorporated herein by reference.

BACKGROUND

1. Technical Field

Embodiments relate to a display device.

2. Description of the Related Art

As the information society develops, the demand for display devices displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight unit providing light to a display panel because each of pixels of the display panel includes light emitting elements emitting light. The light emitting element may be an organic light emitting diode formed of an organic material as a fluorescent material and an inorganic light emitting diode formed of an inorganic material as a fluorescent material.

SUMMARY

Embodiments provide a display device capable of decreasing power consumption by increasing luminous efficiency and decreasing a magnitude of a driving current.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a pixel circuit disposed on a substrate and including at least one transistor, a first pixel electrode disposed on the pixel circuit and electrically connected to the pixel circuit, a bank disposed on the first pixel electrode and including first, second, third, and fourth open parts, a first contact electrode disposed on the bank and the first and second open parts and in contact with the first pixel electrode through the first open part, a second pixel electrode overlapping the second and third open parts, the second pixel electrode and the first pixel electrode formed as a same layer, a second contact electrode disposed on the bank and the third and fourth open parts and in contact with the second pixel electrode through the third open part, and a common pixel electrode overlapping the fourth open part, the common pixel electrode and the second pixel electrode formed as a same layer.

The display device may further include a first light emitting element comprising a first electrode corresponding to the first contact electrode and a second electrode corresponding to the second pixel electrode, and a second light emitting element comprising a first electrode corresponding to the second contact electrode and a second electrode corresponding to the common pixel electrode.

The first light emitting element may further include an electron transport layer disposed on the second pixel electrode, a light emitting layer disposed on the electron transport layer, and a hole transport layer disposed between the light emitting layer and the first contact electrode.

The second light emitting element may further include an electron transport layer disposed on the common pixel electrode, a light emitting layer disposed on the electron transport layer, and a hole transport layer disposed between the light emitting layer and the second contact electrode.

The display device may further include a separation part disposed on the bank and separating the first and second contact electrodes from each other.

The display device may further include a first voltage line supplying a high potential voltage, a data line supplying a data voltage, and an initialization voltage line supplying an initialization voltage. The pixel circuit may include a first transistor electrically connecting the first voltage line and the first pixel electrode to each other based on a voltage of a first node, a second transistor electrically connecting the data line and a gate electrode of the first transistor to each other based on a first gate signal, and a third transistor electrically connecting the initialization voltage line and the first pixel electrode to each other based on a second gate signal different from the first gate signal.

The display device may further include a vertical voltage line supplying a low potential voltage. The common pixel electrode may be electrically connected to the vertical voltage line.

According to an embodiment, a display device may include a pixel circuit disposed on a substrate and including at least one transistor, a first pixel electrode disposed on the pixel circuit and electrically connected to the pixel circuit, a bank disposed on the first pixel electrode and including first, second, and third open parts and a power open part, a contact electrode disposed on the bank and the first and second open parts, a second pixel electrode overlapping the second and third open parts, and in contact with the contact electrode through the second open part, the contact electrode and the first pixel electrode formed as a same layer, a common cathode electrode disposed on the bank, the third open part, and the power open part, and a common pixel electrode overlapping the power open part, and in contact with the common cathode electrode through the power open part, the common pixel electrode and the second pixel electrode formed as a same layer.

The display device may further include a first light emitting element comprising a first electrode corresponding to the first pixel electrode and a second electrode corresponding to the contact electrode, and a second light emitting element comprising a first electrode corresponding to the second pixel electrode and a second electrode corresponding to the common cathode electrode.

The first light emitting element may further include a hole transport layer disposed on the first pixel electrode, a light emitting layer disposed on the hole transport layer, and an electron transport layer disposed between the light emitting layer and the contact electrode.

The second light emitting element may further include a hole transport layer disposed on the second pixel electrode, a light emitting layer disposed on the hole transport layer, and an electron transport layer disposed between the light emitting layer and the common cathode electrode.

The display device may further include a separation part disposed on the bank and separating the contact electrode and the common cathode electrode from each other.

The display device may further include a vertical voltage line supplying a low potential voltage. The common pixel electrode may be electrically connected to the vertical voltage line.

According to an embodiment, a display device may include a pixel circuit disposed on a substrate and including at least one transistor, a driving voltage line disposed on the pixel circuit and supplying a high potential voltage, a bank disposed on the driving voltage line and including first, second, third, and fourth open parts, a first contact electrode disposed on the bank and the first and second open parts and in contact with the driving voltage line through the first open part, a first pixel electrode overlapping the second and third open parts, the first pixel electrode and the driving voltage line formed as a same layer, a second contact electrode disposed on the bank and the third and fourth open parts and in contact with the first pixel electrode through the third open part, and a second pixel electrode overlapping the fourth open part, the second pixel electrode and the first pixel electrode formed as a same layer.

The display device may further include a first light emitting element comprising a first electrode corresponding to the first contact electrode and a second electrode corresponding to the first pixel electrode, and a second light emitting element comprising a first electrode corresponding to the second contact electrode and a second electrode corresponding to the second pixel electrode.

The first light emitting element may further include an electron transport layer disposed on the first pixel electrode, a light emitting layer disposed on the electron transport layer, and a hole transport layer disposed between the light emitting layer and the first contact electrode.

The second light emitting element may further include an electron transport layer disposed on the second pixel electrode, a light emitting layer disposed on the electron transport layer, and a hole transport layer disposed between the light emitting layer and the second contact electrode.

The display device may further include a separation part disposed on the bank and separating the first and second contact electrodes from each other.

The display device may further include a data line supplying a data voltage, an initialization voltage line supplying an initialization voltage, and a low potential line supplying a low potential voltage. The pixel circuit may include a first transistor controlling a driving current based on a voltage of a first node, a second transistor electrically connecting the data line and a gate electrode of the first transistor to each other based on a gate signal, a third transistor electrically connecting the initialization voltage line and a source electrode of the first transistor to each other based on the gate signal, a fourth transistor electrically connecting the driving voltage line and a drain electrode of the first transistor to each other based on the gate signal, a fifth transistor electrically connecting the second electrode of the second light emitting element and the drain electrode of the first transistor to each other based on an emission control signal, and a sixth transistor electrically connecting the source electrode of the first transistor and the low potential line to each other based on the emission control signal.

The second pixel electrode may be electrically connected to a drain electrode of the fifth transistor.

With a display device according to embodiments, by supplying a driving current of a pixel circuit to first and second light emitting elements formed as the same layer and connected to each other in series, it is possible to increase luminous efficiency and decrease a magnitude of the driving current as compared with a case where one light emitting element is included, and accordingly, it is possible to decrease power consumption.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
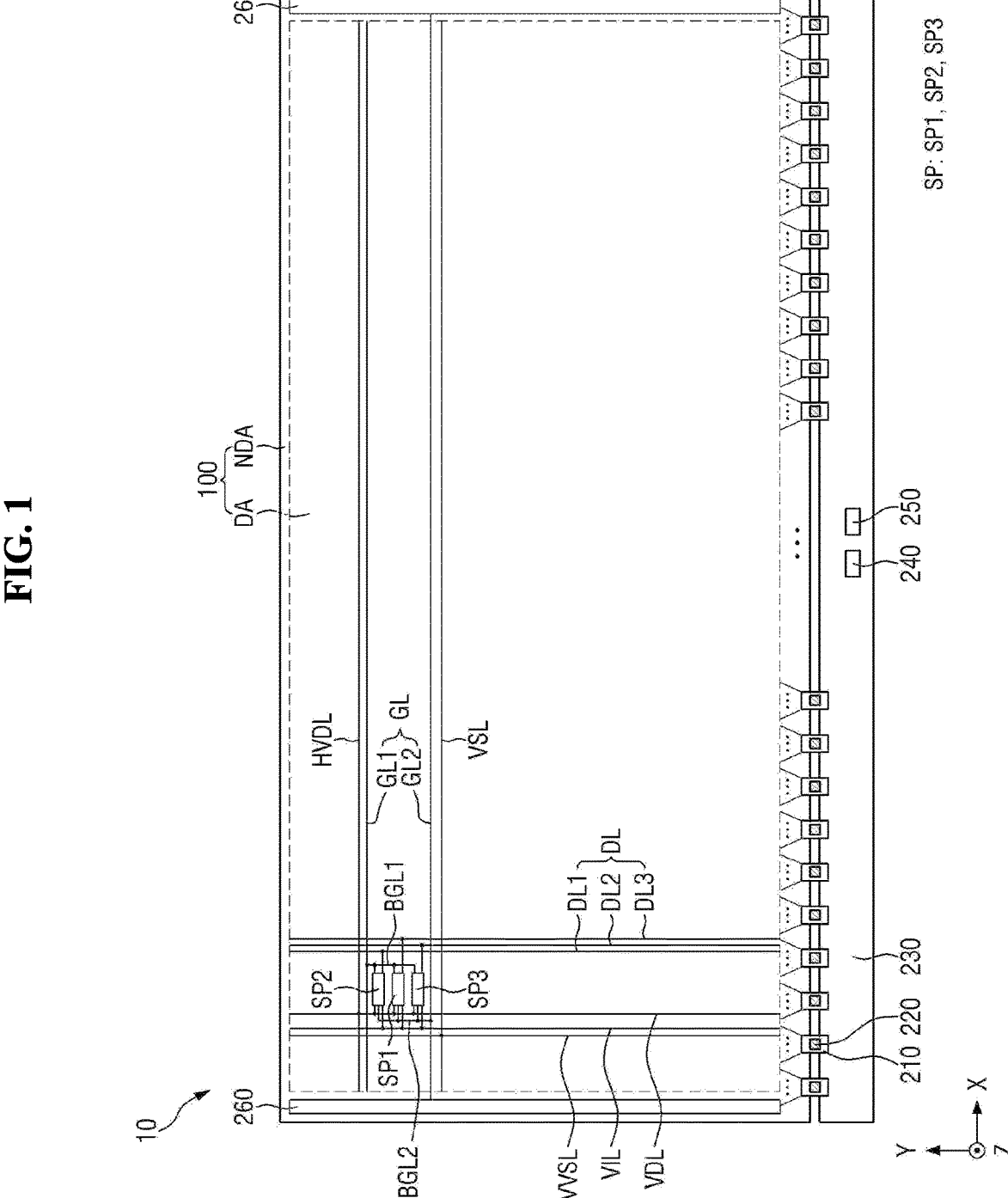
FIG. 1 is a schematic plan view illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For example, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the invention. Further, the blocks, units, parts, and/or modules of some embodiments may be physically combined into more complex blocks, units, and/or modules without departing from the scope of the invention.

Hereinafter, detailed embodiments of the disclosure is described with reference to the accompanying drawings.

FIG. 1 is a plan view illustrating a display device according to an embodiment.

The terms "above", "top", and "upper surface" as used herein refer to an upward direction (i.e., a Z-axis direction) with respect to the display device. The terms "below", "bottom", and "lower surface" as used herein refer to a downward direction (i.e., a direction opposite to the Z axis direction) with respect to the display device. In addition, "left side", "right side", "upper side", and "lower side" refer to directions when the display device is viewed from above. For example, "left side" refers to a direction opposite to an X-axis direction, "right side" refers to the X-axis direction, "upper side" refers to a Y-axis direction, and "lower side" refers to a direction opposite to the Y-axis direction.

Referring to FIG. 1, a display device 10 may be a device that displays a moving image or a still image, and may be used as a display screen of various products such as televisions, laptop computers, monitors, billboards, and Internet of Things (IOT) as well as portable electronic devices such as mobile phones, smartphones, tablet personal computers (PCs), smart watches, watch phones, mobile communication terminals, electronic organizers, electronic books, portable multimedia players (PMPs), navigation devices, and ultra mobile PCs (UMPCs).

The display device 10 may include a display panel 100, flexible films 210, display drivers 220, a circuit board 230, a timing controller 240, a power supply unit 250, and gate drivers 260.

The display panel 100 may have a rectangular shape in plan view. For example, the display panel 100 may have a rectangular shape, in plan view, having long sides in a first direction (e.g., X-axis direction) and short sides in a second direction (e.g., Y-axis direction). A corner where the long side in the first direction (e.g., X-axis direction) and the short side in the second direction (e.g., Y-axis direction) meet may be right-angled or may be rounded with a certain curvature. The shape of the display panel 100 in plan view is not limited to the rectangular shape, and may be other polygonal shapes, a circular shape, or an elliptical shape. As an example, the display panel 100 may be formed to be flat, but embodiments are not limited thereto. As another example, the display panel 100 may be formed to be bent with a certain curvature.

The display panel 100 may include a display area DA and a non-display area NDA.

The display area DA may be an area displaying an image, and may be defined as a central area of the display panel 100. The display area DA may include pixels SP, gate lines GL, data lines DL, initialization voltage lines VIL, first voltage lines VDL, horizontal voltage lines HVDL, vertical voltage lines VVSL, and second voltage lines VSL. The pixels SP may be formed in each of pixel areas crossed by the data lines DL and the gate lines GL. The pixel SP may include first to third pixels SP1, SP2, and SP3. Each of the first to third pixels SP1, SP2, and SP3 may be connected to the gate line GL and the data line DL. Each of the first to third pixels SP1, SP2, and SP3 may be defined as an area of a minimum unit emitting light.

Each of the first to third pixels SP1, SP2, and SP3 may include an organic light emitting diode including an organic light emitting layer, a quantum dot light emitting diode including a quantum dot light emitting layer, a micro light emitting diode, or an inorganic light emitting diode including an inorganic semiconductor.

The first pixel SP1 may emit light of a first color or red light, the second pixel SP2 may emit light of a second color or green light, and the third pixel SP3 may emit light of a third color or blue light. A pixel circuit of the second pixel SP2, a pixel circuit of the first pixel SP1, and a pixel circuit of the third pixel SP3 may be arranged in a direction opposite to the second direction (e.g., Y-axis direction), but the order of the pixel circuits is not limited thereto.

The gate lines GL may include first gate lines GL1 and second gate lines GL2. The first gate lines GL1 may extend in the first direction (e.g., X-axis direction) and may be spaced apart from each other in the second direction (e.g., Y-axis direction). The first gate lines GL1 may receive first gate signals from the gate drivers 260 and supply the first gate signals to first auxiliary gate lines BGL1. The first auxiliary gate lines BGL1 may extend from the first gate lines GL1 and supply the first gate signals to the first to third pixels SP1, SP2, and SP3.

The second gate lines GL2 may extend in the first direction (e.g., X-axis direction) and may be spaced apart from each other in the second direction (e.g., Y-axis direction). The second gate lines GL2 may receive second gate signals from the gate drivers 260 and supply the second gate signals to second auxiliary gate lines BGL2. The second auxiliary gate lines BGL2 may extend from the second gate lines GL2 and supply the second gate signals to the first to third pixels SP1, SP2, and SP3.

The data lines DL may extend in the second direction (e.g., Y-axis direction) and may be spaced apart from each other in the first direction (e.g., X-axis direction). The data lines DL may include first to third data lines DL1, DL2, and DL3. Each of the first to third data lines DL1, DL2, and DL3 may supply a data voltage to each of the first to third pixels SP1, SP2, and SP3.

The initialization voltage lines VIL may extend in the second direction (e.g., Y-axis direction) and may be spaced apart from each other in the first direction (e.g., X-axis direction). The initialization voltage lines VIL may supply initialization voltages received from the display drivers 220 to the pixel circuit of each of the first to third pixels SP1, SP2, and SP3. The initialization voltage lines VIL may receive sensed signals from the pixel circuit of each of the first to third pixels SP1, SP2, and SP3 and supply the sensed signals to the display drivers 220.

The first voltage lines VDL may extend in the second direction (e.g., Y-axis direction) and may be spaced apart from each other in the first direction (e.g., X-axis direction). The first voltage lines VDL may supply driving voltages or high potential voltages received from the power supply unit 250 to the first to third pixels SP1, SP2, and SP3.

The horizontal voltage lines HVDL may extend in the first direction (e.g., X-axis direction) and may be spaced apart from each other in the second direction (e.g., Y-axis direction). The horizontal voltage lines HVDL may be connected to the first voltage lines VDL. The horizontal voltage lines HVDL may receive the driving voltages or the high potential voltages from the first voltage lines VDL.

The vertical voltage lines VVSL may extend in the second direction (e.g., Y-axis direction) and may be spaced apart from each other in the first direction (e.g., X-axis direction). The vertical voltage lines VVSL may be connected to the second voltage lines VSL. The vertical voltage lines VVSL may supply low potential voltages received from the power supply unit 250 to the second voltage lines VSL.

The second voltage lines VSL may extend in the first direction (e.g., X-axis direction) and may be spaced apart from each other in the second direction (e.g., Y-axis direction). The second voltage lines VSL may supply the low potential voltages to the first to third pixels SP1, SP2, and SP3.

Connection structures/relationships between the pixels SP, the gate lines GL, the data lines DL, the initialization voltage lines VIL, the first voltage lines VDL, and the second voltage lines VSL may be designed and changed according to the number and an arrangement of pixels SP.

The non-display area NDA may be defined as an area other than the display area DA in the display panel 100. For example, the non-display area NDA may include fan-out lines connecting the data lines DL, the initialization voltage lines VIL, the first voltage lines VDL, and the vertical voltage lines VVSL to the display drivers 220, the gate drivers 260, and pad parts connected to the flexible films 210.

The flexible films 210 may be connected to the pad parts disposed on the lower side of the non-display area NDA. Input terminals provided on one sides of the flexible films 210 may be attached to the circuit board 230 by a film attaching process, and output terminals provided on the other sides of the flexible films 210 may be attached to the pad parts by a film attaching process. For example, the flexible films 210 may be bent like a tape carrier package or a chip on film. The flexible films 210 may be bent below the display panel 100 in order to decrease a bezel area of the display device 10.

The display drivers 220 may be mounted on the flexible films 210. For example, the display driver 220 may be implemented as an integrated circuit (IC). The display drivers 220 may receive digital video data and data control signals from the timing controller 240, convert the digital video data into analog data voltages according to the data control signals, and supply the analog data voltages to the data lines DL through the fan-out lines.

The circuit board 230 may support the timing controller 240 and the power supply unit 250, and supply signals and power to the display drivers 220. For example, the circuit board 230 may supply signals supplied from the timing controller 240 and source voltages supplied from the power supply unit 250 to the flexible films 210 and the display drivers 220 in order to display an image in each pixel. For example, signal lines and power lines may be provided on the circuit board 230.

The timing controller 240 may be mounted on the circuit board 230 and may receive image data and timing synchronization signals supplied from a display driving system or a graphic device through a user connector provided on the circuit board 230. The timing controller 240 may generate the digital video data by aligning the image data to be suitable for a pixel arrangement structure based on the timing synchronization signals, and may supply the generated digital video data to the display drivers 220. The timing controller 240 may generate data control signals and gate control signals based on the timing synchronization signals. The timing controller 240 may control a supply timing of data voltages of the display drivers 220 based on the data control signals, and may control a supply timing of gate signals of the gate drivers 260 based on the gate control signals.

The power supply unit 250 may be disposed on the circuit board 230 and may supply source voltages to the flexible films 210 and the display drivers 220. For example, the power supply unit 250 may generate driving voltages or high potential voltages and supply the driving voltages or the high potential voltages to the first voltage lines VDL, may generate low potential voltages and supply the low potential voltages to the vertical voltage lines VVSL, and may generate initialization voltages and supply the initialization voltages to the initialization voltage lines VIL.

The gate drivers 260 may be disposed on the left and right sides of the non-display area NDA. The gate drivers 260 may generate gate signals based on the gate control signals supplied from the timing controller 240. The gate control signals may include start signals, clock signals, and source voltages, but embodiments are not limited thereto. The gate drivers 260 may supply the gate signals to the gate lines GL according to a set order.

Figure 2:
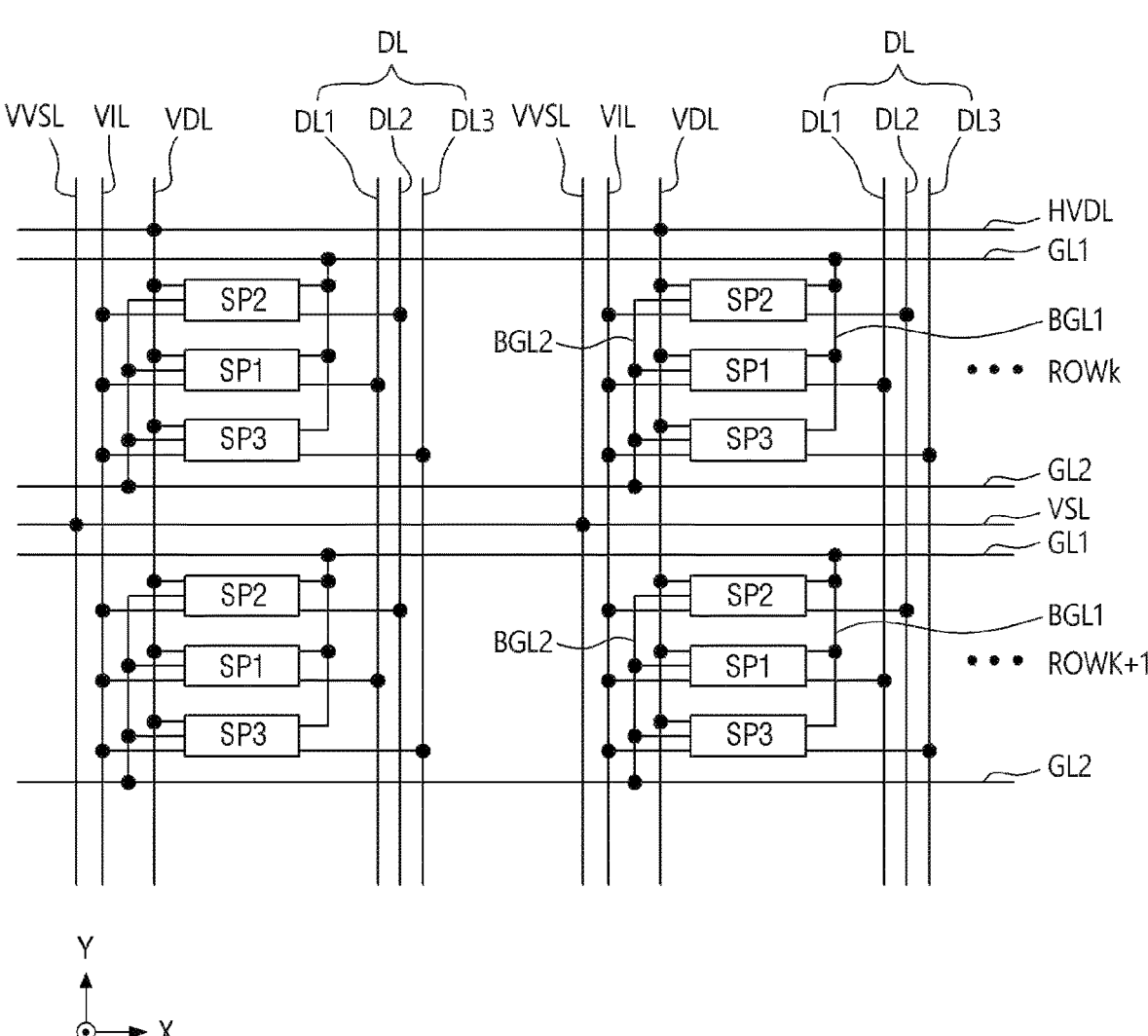
FIG. 2 is a schematic view illustrating pixels and lines of the display device according to an embodiment.

FIG. 2 is a schematic view illustrating pixels and lines of the display device according to an embodiment.

Referring to FIG. 2, the pixel SP may include first to third pixels SP1, SP2, and SP3. A pixel circuit of the second pixel SP2, a pixel circuit of the first pixel SP1, and a pixel circuit of the third pixel SP3 may be arranged in the direction opposite to the second direction (e.g., Y-axis direction), but the order of the pixel circuits is not limited thereto.

Each of the first to third pixels SP1, SP2, and SP3 may be connected to the first voltage line VDL, the initialization voltage line VIL, the gate line GL, and the data line DL.

The first voltage line VDL may extend in the second direction (e.g., Y-axis direction). The first voltage line VDL may be disposed on the left side of the pixel circuits of the first to third pixels SP1, SP2, and SP3. The first voltage line VDL may supply the driving voltage or the high potential voltage to a transistor of each of the first to third pixels SP1, SP2, and SP3.

The horizontal voltage line HVDL may extend in the first direction (e.g., X-axis direction). The horizontal voltage line HVDL may be disposed on the upper side of a first gate line GL1 disposed in a k-th row ROWk (here, k is a positive integer). The horizontal voltage line HVDL may be connected to the first voltage line VDL. The horizontal voltage line HVDL may receive the driving voltage or the high potential voltage from the first voltage line VDL.

The initialization voltage line VIL may extend in the second direction (e.g., Y-axis direction). The initialization voltage line VIL may be disposed on the left side of the second auxiliary gate line BGL2. The initialization voltage line VIL may be disposed between the vertical voltage line VVSL and the second auxiliary gate line BGL2. The initialization voltage line VIL may supply the initialization voltage to the pixel circuit of each of the first to third pixels SP1, SP2, and SP3. The initialization voltage line VIL may receive a sensed signal from the pixel circuit of each of the first to third pixels SP1, SP2, and SP3 and supply the sensed signal to the display driver 220.

The vertical voltage line VVSL may extend in the second direction (e.g., Y-axis direction). The vertical voltage line VVSL may be disposed on the left side of the initialization voltage line VIL. The vertical voltage line VVSL may be connected between the power supply unit 250 and the second voltage line VSL. The vertical voltage line VVSL may supply the low potential voltage supplied from the power supply unit 250 to the second voltage line VSL.

The second voltage line VSL may extend in the first direction (e.g., X-axis direction). The second voltage line VSL may be disposed on the upper side of a first gate line GL1 disposed in a (k+1)-th row ROWk+1. The second voltage line VSL may supply the low potential voltage received from the vertical voltage line VVSL to light emitting element layers of the first to third pixels SP1, SP2, and SP3.

The first gate line GL1 may extend in the first direction (e.g., X-axis direction). The first gate line GL1 may be disposed on the upper side of the pixel circuit of the second pixel SP2. The first gate line GL1 may supply the first gate signal received from the gate driver 260 to the first auxiliary gate line BGL1. The first auxiliary gate line BGL1 may extend from the first gate line GL1 in the direction opposite to the second direction (e.g., Y-axis direction). The first auxiliary gate line BGL1 may be disposed on the right side of the pixel circuits of the first to third pixels SP1, SP2, and SP3. The first auxiliary gate line BGL1 may supply the first gate signal received from the first gate line GL1 to the pixel circuits of the first to third pixels SP1, SP2, and SP3.

The second gate line GL2 may extend in the first direction (e.g., X-axis direction). The second gate line GL2 may be disposed on the lower side of the pixel circuit of the third pixel SP3. The second gate line GL2 may supply the second gate signal received from the gate driver 260 to the second auxiliary gate line BGL2. The second auxiliary gate line BGL2 may extend from the second gate line GL2 in the second direction (e.g., Y-axis direction). The second auxiliary gate line BGL2 may be disposed on the left side of the first voltage line VDL. The second auxiliary gate line BGL2 may supply the second gate signal received from the second gate line GL2 to the pixel circuits of the first to third pixels SP1, SP2, and SP3.

The data lines DL may extend in the second direction (e.g., Y-axis direction). The data lines DL may supply the data voltages to the pixels SP. The data lines DL may include first to third data lines DL1, DL2, and DL3.

The first data line DL1 may extend in the second direction (e.g., Y-axis direction). The first data line DL1 may be disposed on the right side of the first auxiliary gate line BGL1. The first data line DL1 may supply the data voltage received from the display driver 220 to the pixel circuit of the first pixel SP1.

The second data line DL2 may extend in the second direction (e.g., Y-axis direction). The second data line DL2 may be disposed on the right side of the first data line DL1. The second data line DL2 may supply the data voltage received from the display driver 220 to the pixel circuit of the second pixel SP2.

The third data line DL3 may extend in the second direction (e.g., Y-axis direction). The third data line DL3 may be disposed on the right side of the second data line DL2. The third data line DL3 may supply the data voltage received from the display driver 220 to the pixel circuit of the third pixel SP3.

Figure 3:
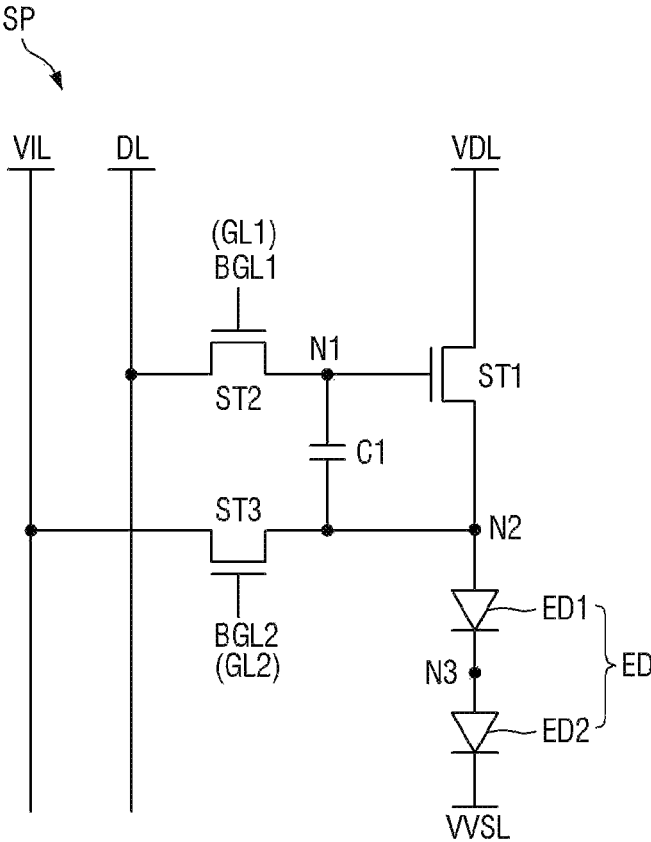
FIG. 3 is a schematic diagram of an equivalent circuit illustrating a pixel of the display device according to an embodiment.

FIG. 3 is a schematic diagram of an equivalent circuit illustrating a pixel of the display device according to an embodiment.

Referring to FIG. 3, each of the pixels SP may be connected to a first voltage line VDL, a data line DL, an initialization voltage line VIL, a first gate line GL1, a second gate line GL2, and a vertical voltage line VVSL.

Each of the first to third pixels SP1, SP2, and SP3 may include a pixel circuit and a plurality of light emitting elements ED. The pixel circuit of each of the first to third pixels SP1, SP2, and SP3 may include first to third transistors ST1, ST2, and ST3 and a first capacitor C1.

The first transistor ST1 may include a gate electrode, a drain electrode, and a source electrode. The gate electrode of the first transistor ST1 may be connected to a first node N1, the drain electrode of the first transistor ST1 may be connected to the first voltage line VDL, and the source electrode of the first transistor ST1 may be connected to a second node N2. The first transistor ST1 may control a drain-source current (or a driving current) based on a data voltage applied to the gate electrode.

The light emitting elements ED may include first and second light emitting elements ED1 and ED2. The first and second light emitting elements ED1 and ED2 may be connected to each other in series. The first and second light emitting elements ED1 and ED2 may receive the driving current to emit light. A light emission amount or luminance of the light emitting element ED may be proportional to a magnitude of the driving current. The light emitting element ED may be an organic light emitting diode including an organic light emitting layer, a quantum dot light emitting diode including a quantum dot light emitting layer, a micro light emitting diode, or an inorganic light emitting diode including an inorganic semiconductor.

A first electrode of the first light emitting element ED1 may be connected to the second node N2, and a second electrode of the first light emitting element ED1 may be connected to a third node N3. The first electrode of the first light emitting element ED1 may be connected to the source electrode of the first transistor ST1, a drain electrode of the third transistor ST3, and a second capacitor electrode of the first capacitor C1 through the second node N2. The second electrode of the first light emitting element ED1 may be connected to a first electrode of the second light emitting element ED2 through the third node N3.

The first electrode of the second light emitting element ED2 may be connected to the third node N3, and a second electrode of the second light emitting element ED2 may be connected to the vertical voltage line VVSL.

The second transistor ST2 may be turned on by a first gate signal of the first gate line GL1 to electrically connect the data line DL and the first node N1, which is the gate electrode of the first transistor ST1, to each other. The second transistor ST2 may be turned on based on the first gate signal to supply a data voltage to the first node N1. A gate electrode of the second transistor ST2 may be connected to the first gate line GL1, a drain electrode of the second transistor ST2 may be connected to the data line DL, and a source electrode of the second transistor ST2 may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by a second gate signal of the second gate line GL2 to electrically connect the initialization voltage line VIL and the second node N2, which is the source electrode of the first transistor ST1, to each other. The third transistor ST3 may be turned on based on the second gate signal to supply an initialization voltage to the second node N2. The third transistor ST3 may be turned on based on the second gate signal to supply a sensed signal to the initialization voltage line VIL. A gate electrode of the third transistor ST3 may be connected to the second gate line GL2, the drain electrode of the third transistor ST3 may be connected to the second node N2, and a source electrode of the third transistor ST3 may be connected to the initialization voltage line VIL. The drain electrode of the third transistor ST3 may be connected to the source electrode of the first transistor ST1, the second capacitor electrode of the first capacitor C1, and the first electrode of the first light emitting element ED1 through the second node N2.

Figure 4:
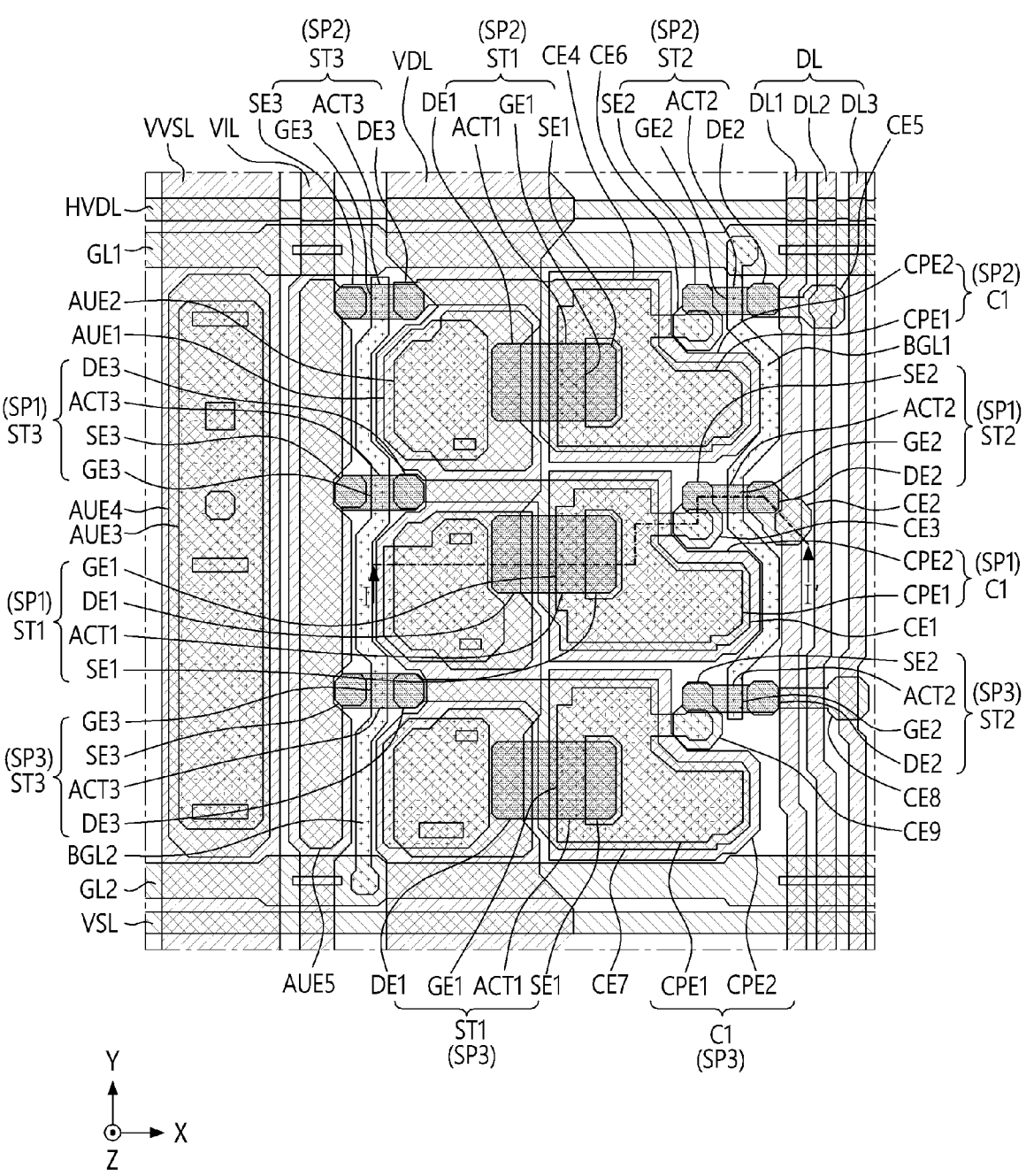
FIG. 4 is a schematic plan view illustrating a thin film transistor layer of the display device of FIG. 3.
Figure 5:
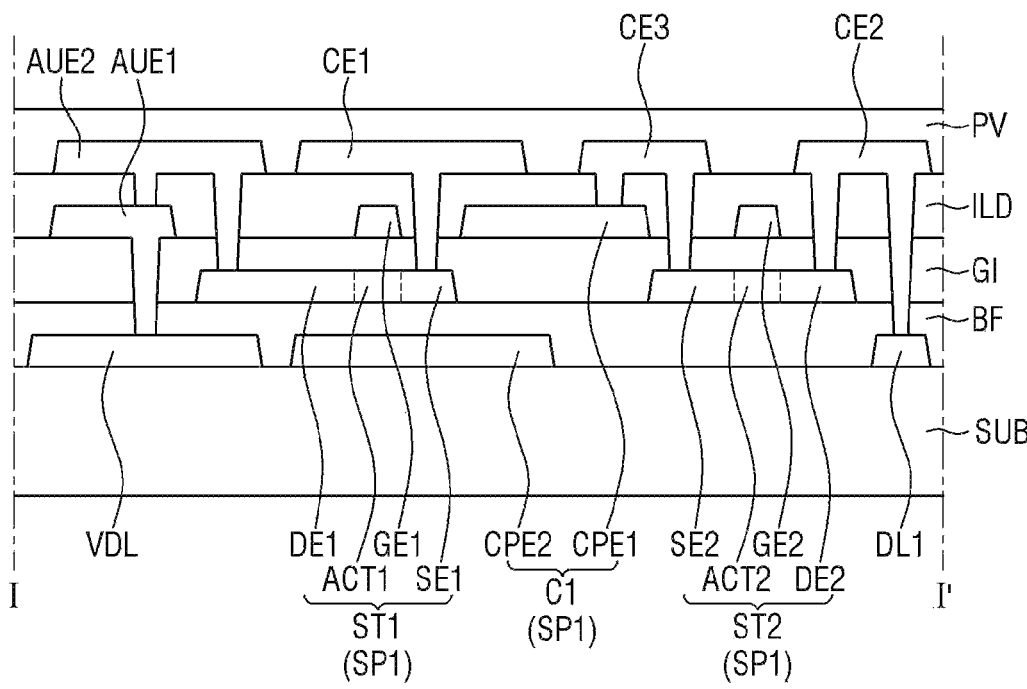
FIG. 5 is a schematic cross-sectional view taken along line I-I' of FIG. 4.

FIG. 4 is a schematic plan view illustrating a thin film transistor layer of the display device of FIG. 3, and FIG. 5 is a schematic cross-sectional view taken along line I-I' of FIG. 4.

Referring to FIGS. 4 and 5, the display area DA may include first to third pixels SP1, SP2, and SP3, a first voltage line VDL, a horizontal voltage line HVDL, an initialization voltage line VIL, first and second gate lines GL1 and GL2, first and second auxiliary gate lines BGL1 and BGL2, a data line DL, a second voltage line VSL, and a vertical voltage line VVSL.

The pixel SP may include first to third pixels SP1, SP2, and SP3. A pixel circuit of the second pixel SP2, a pixel circuit of the first pixel SP1, and a pixel circuit of the third pixel SP3 may be arranged in the direction opposite to the second direction (e.g., Y-axis direction), but the order of the pixel circuits is not limited thereto.

The first voltage line VDL may be disposed at (or formed as) a first metal layer MTL1 on a substrate SUB. The first voltage line VDL may be disposed on the left side of the pixel circuits of the first to third pixels SP1, SP2, and SP3. The first voltage line VDL may overlap a first auxiliary electrode AUE1 of a second metal layer MTL2 and a second auxiliary electrode AUE2 of a third metal layer MTL3. The second metal layer MTL2 may be disposed on a gate insulating layer GI covering an active layer ACTL, and the third metal layer MTL3 may be disposed on an interlayer insulating layer ILD covering the second metal layer MTL2. A passivation layer PV may cover the third metal layer MTL3. The first auxiliary electrode AUE1 may be connected to the first voltage line VDL. The second auxiliary electrode AUE2 may be connected to the first auxiliary electrode AUE1. The first voltage line VDL may be connected to the first and second auxiliary electrodes AUE1 and AUE2 to decrease line resistance.

The second auxiliary electrode AUE2 may be connected to a drain electrode DE1 of a first transistor ST1 of each of the first to third pixels SP1, SP2, and SP3. Accordingly, the first voltage line VDL may supply the driving voltage to the first to third pixels SP1, SP2, and SP3 through the second auxiliary electrode AUE2.

The horizontal voltage line HVDL may be disposed at (or formed as) the third metal layer MTL3. The horizontal voltage line HVDL may be disposed on the upper side of the first gate line GL1. The horizontal voltage line HVDL may be connected to the first voltage line VDL to receive the driving voltage.

The initialization voltage line VIL may be disposed at (or formed as) the first metal layer MTL1. The initialization voltage line VIL may be disposed on the left side of the first voltage line VDL. The initialization voltage line VIL may overlap a fifth auxiliary electrode AUE5 of the third metal layer MTL3 and may be connected to the fifth auxiliary electrode AUE5. The initialization voltage line VIL may be connected to the fifth auxiliary electrode AUE5 to decrease line resistance.

The fifth auxiliary electrode AUE5 may be connected to a source electrode SE3 of a third transistor ST3 of each of the first to third pixels SP1, SP2, and SP3. Accordingly, the initialization voltage line VIL may supply the initialization voltage to the third transistor ST3 of each of the first to third pixels SP1, SP2, and SP3 and receive the sensed signal from the third transistor ST3 of each of the first to third pixels SP1, SP2, and SP3, through the fifth auxiliary electrode AUE5.

The vertical voltage line VVSL may be disposed at (or formed as) the first metal layer MTL1. The vertical voltage line VVSL may be disposed on the left side of the initialization voltage line VIL. The vertical voltage line VVSL may overlap a third auxiliary electrode AUE3 of the second metal layer MTL2 and a fourth auxiliary electrode AUE4 of the third metal layer MTL3. The third auxiliary electrode AUE3 may be connected to the vertical voltage line VVSL, and the fourth auxiliary electrode AUE4 may be connected to the third auxiliary electrode AUE3. The vertical voltage line VVSL may be connected to the third and fourth auxiliary electrodes AUE3 and AUE4 to decrease line resistance. The vertical voltage line VVSL may be connected to the second voltage line VSL to supply the low potential voltage to the second voltage line VSL.

The second voltage line VSL may be disposed at (or formed as) the third metal layer MTL3. The second voltage line VSL may be disposed on the lower side of the second gate line GL2. The second voltage line VSL may receive the low potential voltage from the vertical voltage line VVSL.

The first gate line GL1 may be disposed at (or formed as) the third metal layer MTL3. The first gate line GL1 may be disposed on the upper side of the pixel circuit of the second pixel SP2. The first gate line GL1 may be connected to the first auxiliary gate line BGL1 and may supply the first gate signal received from the gate driver 260 to the first auxiliary gate line BGL1.

The first auxiliary gate line BGL1 may be disposed at (or formed as) the second metal layer MTL2. The first auxiliary gate line BGL1 may protrude from the first gate line GL1 in the direction opposite to the second direction (e.g., Y-axis direction). The first auxiliary gate line BGL1 may be disposed on the right side of the pixel circuits of the first to third pixels SP1, SP2, and SP3. The first auxiliary gate line BGL1 may supply the first gate signal received from the first gate line GL1 to a second transistor ST2 of each of the first to third pixels SP1, SP2, and SP3.

The second gate line GL2 may be disposed at (or formed as) the third metal layer MTL3. The second gate line GL2 may be disposed on the lower side of the pixel circuit of the third pixel SP3. The second gate line GL2 may be connected to the second auxiliary gate line BGL2 and may supply the second gate signal received from the gate driver 260 to the second auxiliary gate line BGL2.

The second auxiliary gate line BGL2 may be disposed at (or formed as) the second metal layer MTL2. The second auxiliary gate line BGL2 may protrude from the second gate line GL2 in the second direction (e.g., Y-axis direction). The second auxiliary gate line BGL2 may be disposed between the initialization voltage line VIL and the first voltage line VDL. The second auxiliary gate line BGL2 may supply the second gate signal received from the second gate line GL2 to the third transistor ST3 of each of the first to third pixels SP1, SP2, and SP3.

The first data line DL1 may be disposed at (or formed as) the first metal layer MTL1. The first data line DL1 may be disposed on the right side of the first auxiliary gate line BGL1. A second connection electrode CE2 of the third metal layer MTL3 may electrically connect the first data line DL1 and a drain electrode DE2 of the second transistor ST2 of the first pixel SP1 to each other. Accordingly, the first data line DL1 may supply the data voltage to the second transistor ST2 of the first pixel SP1 through the second connection electrode CE2.

The second data line DL2 may be disposed at (or formed as) the first metal layer MTL1. The second data line DL2 may be disposed on the right side of the first data line DL1. A fifth connection electrode CE5 of the third metal layer MTL3 may electrically connect the second data line DL2 and a drain electrode DE2 of the second transistor ST2 of the second pixel SP2 to each other. Accordingly, the second data line DL2 may supply the data voltage to the second transistor ST2 of the second pixel SP2 through the fifth connection electrode CE5.

The third data line DL3 may be disposed at (or formed as) the first metal layer MTL1. The third data line DL3 may be disposed on the right side of the second data line DL2. An eighth connection electrode CE8 of the third metal layer MTL3 may electrically connect the third data line DL3 and a drain electrode DE2 of the second transistor ST2 of the third pixel SP3 to each other. Accordingly, the third data line DL3 may supply the data voltage to the second transistor ST2 of the third pixel SP3 through the eighth connection electrode CE8.

The pixel circuit of the first pixel SP1 may include first to third transistors ST1, ST2, and ST3. The first transistor ST1 of the first pixel SP1 may include an active region ACT1, a gate electrode GE1, the drain electrode DE1, and a source electrode SE1. The active region ACT1 of the first transistor ST1 may be disposed at (or formed as) the active layer ACTL, and may overlap the gate electrode GE1 of the first transistor ST1. The active layer ACTL may be disposed on a buffer layer BF covering the first metal layer MTL1.

The gate electrode GE1 of the first transistor ST1 may be disposed at (or formed as) the second metal layer MTL2. The gate electrode GE1 of the first transistor ST1 may be a portion of a first capacitor electrode CPE1 of a first capacitor C1.

The drain electrode DE1 and the source electrode SE1 of the first transistor ST1 may be made to be conductive by heat-treating the active layer ACTL. The drain electrode DE1 and the source electrode SE1 may be made to be conductive as N-type semiconductors, but embodiments are not limited thereto. The drain electrode DE1 of the first transistor ST1 may be electrically connected to the first voltage line VDL through the second auxiliary electrode AUE2. The drain electrode DE1 of the first transistor ST1 may receive the driving voltage from the first voltage line VDL.

The source electrode SE1 of the first transistor ST1 may be connected to a first connection electrode CE1 of the third metal layer MTL3. The first connection electrode CE1 may be connected to a second capacitor electrode CPE2 of the first metal layer MTL1. Accordingly, the first capacitor C1 may be doubly formed between the first capacitor electrode CPE1 and the second capacitor electrode CPE2 and between the first capacitor electrode CPE1 and the first connection electrode CE1.

The first connection electrode CE1 may be electrically connected to a light emitting element ED of the first pixel SP1. Accordingly, the first connection electrode CE1 may supply the driving current received from the pixel circuit of the first pixel SP1 to the light emitting element ED.

The second transistor ST2 of the first pixel SP1 may include an active region ACT2, a gate electrode GE2, the drain electrode DE2, and a source electrode SE2. The active region ACT2 of the second transistor ST2 may be disposed at (or formed as) the active layer ACTL, and may overlap the gate electrode GE2 of the second transistor ST2.

The gate electrode GE2 of the second transistor ST2 may be disposed at (or formed as) the second metal layer MTL2. The gate electrode GE2 of the second transistor ST2 may be a portion of the first auxiliary gate line BGL1.

The drain electrode DE2 and the source electrode SE2 of the second transistor ST2 may be made to be conductive by heat-treating the active layer ACTL. The drain electrode DE2 of the second transistor ST2 may be electrically connected to the first data line DL1 through the second connection electrode CE2. Accordingly, the first data line DL1 may supply the data voltage to the second transistor ST2 of the first pixel SP1 through the second connection electrode CE2. The source electrode SE2 of the second transistor ST2 may be electrically connected to the first capacitor electrode CPE1 of the first capacitor C1 through a third connection electrode CE3 of the third metal layer MTL3.

The third transistor ST3 of the first pixel SP1 may include an active region ACT3, a gate electrode GE3, a drain electrode DE3, and the source electrode SE3. The active region ACT3 of the third transistor ST3 may be disposed at (or formed as) the active layer ACTL, and may overlap the gate electrode GE3 of the third transistor ST3.

The gate electrode GE3 of the third transistor ST3 may be disposed at (or formed as) the second metal layer MTL2. The gate electrode GE3 of the third transistor ST3 may be a portion of the second auxiliary gate line BGL2.

The drain electrode DE3 and the source electrode SE3 of the third transistor ST3 may be made to be conductive by heat-treating the active layer ACTL. The drain electrode DE3 of the third transistor ST3 may be connected to an extension part of the first connection electrode CE1. The drain electrode DE3 of the third transistor ST3 may be electrically connected to the source electrode SE1 of the first transistor ST1 and the second capacitor electrode CPE2 of the first capacitor C1 through the first connection electrode CE1.

The source electrode SE3 of the third transistor ST3 may be electrically connected to the initialization voltage line VIL through the fifth auxiliary electrode AUE5. The source electrode SE3 of the third transistor ST3 may receive the initialization voltage from the initialization voltage line VIL. The source electrode SE3 of the third transistor ST3 may supply the sensed signal to the initialization voltage line VIL.

The pixel circuit of the second pixel SP2 may include first to third transistors ST1, ST2, and ST3. The first transistor ST1 of the second pixel SP2 may include an active region ACT1, a gate electrode GE1, the drain electrode DE1, and a source electrode SE1. The active region ACT1 of the first transistor ST1 may be disposed at (or formed as) the active layer ACTL, and may overlap the gate electrode GE1 of the first transistor ST1.

The gate electrode GE1 of the first transistor ST1 may be disposed at (or formed as) the second metal layer MTL2. The gate electrode GE1 of the first transistor ST1 may be a portion of a first capacitor electrode CPE1 of a first capacitor C1.

The drain electrode DE1 and the source electrode SE1 of the first transistor ST1 may be made to be conductive by heat-treating the active layer ACTL. The drain electrode DE1 and the source electrode SE1 may be made to be conductive as N-type semiconductors, but embodiments are not limited thereto. The drain electrode DE1 of the first transistor ST1 may be electrically connected to the first voltage line VDL through the second auxiliary electrode AUE2. The drain electrode DE1 of the first transistor ST1 may receive the driving voltage from the first voltage line VDL.

The source electrode SE1 of the first transistor ST1 may be connected to a fourth connection electrode CE4 of the third metal layer MTL3. The fourth connection electrode CE4 may be connected to a second capacitor electrode CPE2 of the first metal layer MTL1. Accordingly, the first capacitor C1 may be doubly formed between the first capacitor electrode CPE1 and the second capacitor electrode CPE2 and between the first capacitor electrode CPE1 and the fourth connection electrode CE4.

The fourth connection electrode CE4 may be electrically connected to a light emitting element ED of the second pixel SP2. Accordingly, the fourth connection electrode CE4 may supply the driving current received from the pixel circuit of the second pixel SP2 to the light emitting element ED.

The second transistor ST2 of the second pixel SP2 may include an active region ACT2, a gate electrode GE2, the drain electrode DE2, and a source electrode SE2. The active region ACT2 of the second transistor ST2 may be disposed at (or formed as) the active layer ACTL, and may overlap the gate electrode GE2 of the second transistor ST2.

The gate electrode GE2 of the second transistor ST2 may be disposed at (or formed as) the second metal layer MTL2. The gate electrode GE2 of the second transistor ST2 may be a portion of the first auxiliary gate line BGL1.

The drain electrode DE2 and the source electrode SE2 of the second transistor ST2 may be made to be conductive by heat-treating the active layer ACTL. The drain electrode DE2 of the second transistor ST2 may be electrically connected to the second data line DL2 through the fifth connection electrode CE5. Accordingly, the second data line DL2 may supply the data voltage to the second transistor ST2 of the second pixel SP2 through the fifth connection electrode CE5. The source electrode SE2 of the second transistor ST2 may be electrically connected to the first capacitor electrode CPE1 of the first capacitor C1 through a sixth connection electrode CE6 of the third metal layer MTL3.

The third transistor ST3 of the second pixel SP2 may include an active region ACT3, a gate electrode GE3, a drain electrode DE3, and the source electrode SE3. The active region ACT3 of the third transistor ST3 may be disposed at (or formed as) the active layer ACTL, and may overlap the gate electrode GE3 of the third transistor ST3.

The gate electrode GE3 of the third transistor ST3 may be disposed at (or formed as) the second metal layer MTL2. The gate electrode GE3 of the third transistor ST3 may be a portion of the second auxiliary gate line BGL2.

The drain electrode DE3 and the source electrode SE3 of the third transistor ST3 may be made to be conductive by heat-treating the active layer ACTL. The drain electrode DE3 of the third transistor ST3 may be connected to an extension part of the fourth connection electrode CE4. The drain electrode DE3 of the third transistor ST3 may be electrically connected to the source electrode SE1 of the first transistor ST1 and the second capacitor electrode CPE2 of the first capacitor C1 through the fourth connection electrode CE4.

The source electrode SE3 of the third transistor ST3 may be electrically connected to the initialization voltage line VIL through the fifth auxiliary electrode AUE5. The source electrode SE3 of the third transistor ST3 may receive the initialization voltage from the initialization voltage line VIL. The source electrode SE3 of the third transistor ST3 may supply the sensed signal to the initialization voltage line VIL.

The pixel circuit of the third pixel SP3 may include first to third transistors ST1, ST2, and ST3. The first transistor ST1 of the third pixel SP3 may include an active region ACT1, a gate electrode GE1, the drain electrode DE1, and a source electrode SEL. The active region ACT1 of the first transistor ST1 may be disposed at (or formed as) the active layer ACTL, and may overlap the gate electrode GE1 of the first transistor ST1.

The gate electrode GE1 of the first transistor ST1 may be disposed at (or formed as) the second metal layer MTL2. The gate electrode GE1 of the first transistor ST1 may be a portion of a first capacitor electrode CPE1 of a first capacitor C1.

The drain electrode DE1 and the source electrode SE1 of the first transistor ST1 may be made to be conductive by heat-treating the active layer ACTL. The drain electrode DE1 and the source electrode SE1 may be made to be conductive as N-type semiconductors, but embodiments are not limited thereto. The drain electrode DE1 of the first transistor ST1 may be electrically connected to the first voltage line VDL through the second auxiliary electrode AUE2. The drain electrode DE1 of the first transistor ST1 may receive the driving voltage from the first voltage line VDL.

The source electrode SE1 of the first transistor ST1 may be connected to a seventh connection electrode CE7 of the third metal layer MTL3. The seventh connection electrode CE7 may be connected to a second capacitor electrode CPE2 of the first metal layer MTL1. Accordingly, the first capacitor C1 may be doubly formed between the first capacitor electrode CPE1 and the second capacitor electrode CPE2 and between the first capacitor electrode CPE1 and the seventh connection electrode CE7.

The seventh connection electrode CE7 may be electrically connected to a light emitting element ED of the third pixel SP3. Accordingly, the seventh connection electrode CE7 may supply the driving current received from the pixel circuit of the third pixel SP3 to the light emitting element ED.

The second transistor ST2 of the third pixel SP2 may include an active region ACT2, a gate electrode GE2, the drain electrode DE2, and a source electrode SE2. The active region ACT2 of the second transistor ST2 may be disposed at (or formed as) the active layer ACTL, and may overlap the gate electrode GE2 of the second transistor ST2.

The gate electrode GE2 of the second transistor ST2 may be disposed at (or formed as) the second metal layer MTL2. The gate electrode GE2 of the second transistor ST2 may be a portion of the first auxiliary gate line BGL1.

The drain electrode DE2 and the source electrode SE2 of the second transistor ST2 may be made to be conductive by heat-treating the active layer ACTL. The drain electrode DE2 of the second transistor ST2 may be electrically connected to the third data line DL3 through the eighth connection electrode CE8. Accordingly, the third data line DL3 may supply the data voltage to the second transistor ST2 of the third pixel SP3 through the eighth connection electrode CE8. The source electrode SE2 of the second transistor ST2 may be electrically connected to the first capacitor electrode CPE1 of the first capacitor C1 through a ninth connection electrode CE9 of the third metal layer MTL3.

The third transistor ST3 of the third pixel SP3 may include an active region ACT3, a gate electrode GE3, a drain electrode DE3, and the source electrode SE3. The active region ACT3 of the third transistor ST3 may be disposed at (or formed as) the active layer ACTL, and may overlap the gate electrode GE3 of the third transistor ST3.

The gate electrode GE3 of the third transistor ST3 may be disposed at (or formed as) the second metal layer MTL2. The gate electrode GE3 of the third transistor ST3 may be a portion of the second auxiliary gate line BGL2.

The drain electrode DE3 and the source electrode SE3 of the third transistor ST3 may be made to be conductive by heat-treating the active layer ACTL. The drain electrode DE3 of the third transistor ST3 may be connected to a second extension part of the seventh connection electrode CE7. The drain electrode DE3 of the third transistor ST3 may be electrically connected to the source electrode SE1 of the first transistor ST1 and the second capacitor electrode CPE2 of the first capacitor C1 through the seventh connection electrode CE7.

The source electrode SE3 of the third transistor ST3 may be electrically connected to the initialization voltage line VIL through the fifth auxiliary electrode AUE5. The source electrode SE3 of the third transistor ST3 may receive the initialization voltage from the initialization voltage line VIL. The source electrode SE3 of the third transistor ST3 may supply the sensed signal to the initialization voltage line VIL.

Figure 6:
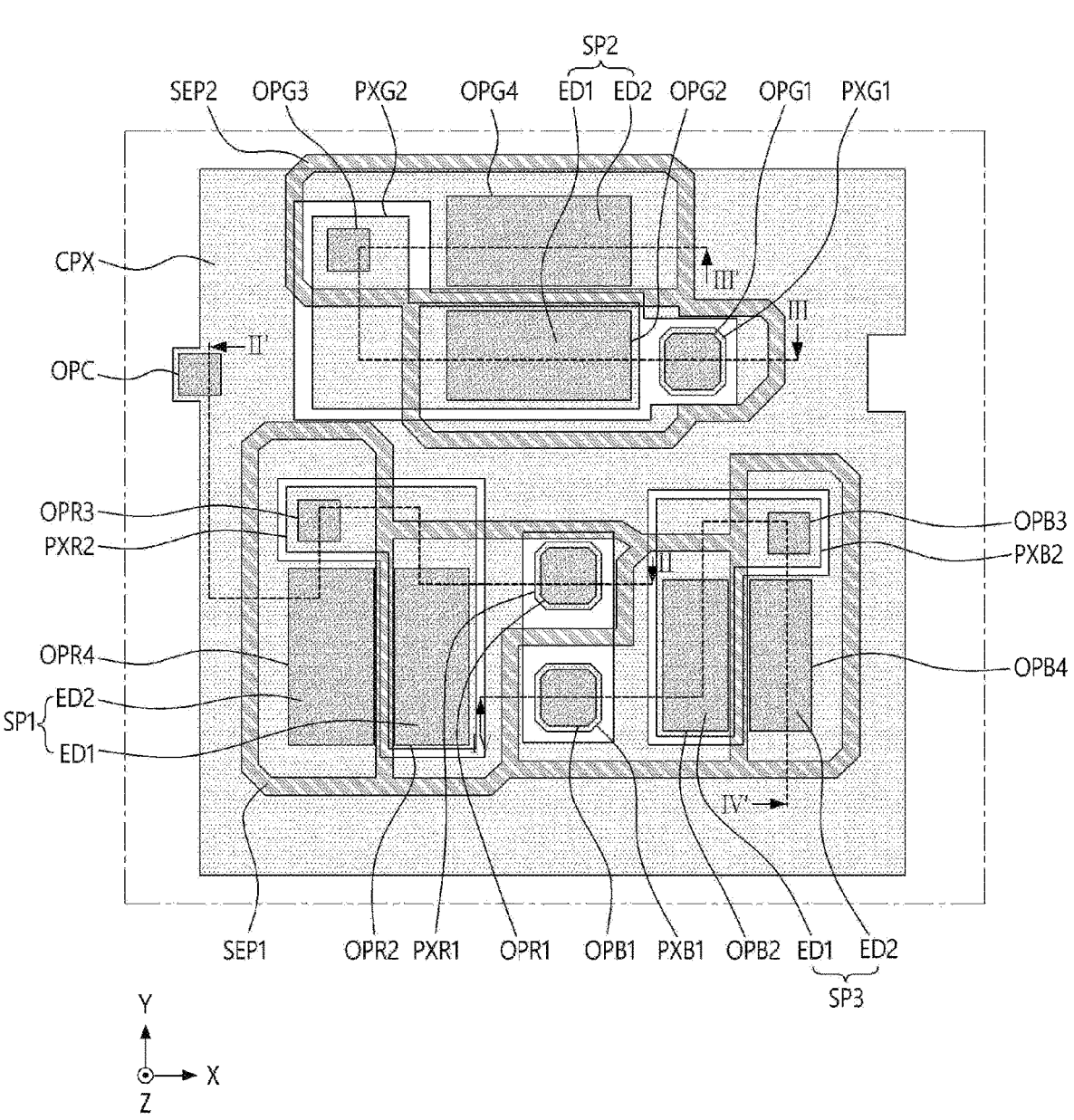
FIG. 6 is a schematic plan view illustrating a light emitting element layer of the display device according to an embodiment.
Figure 7:
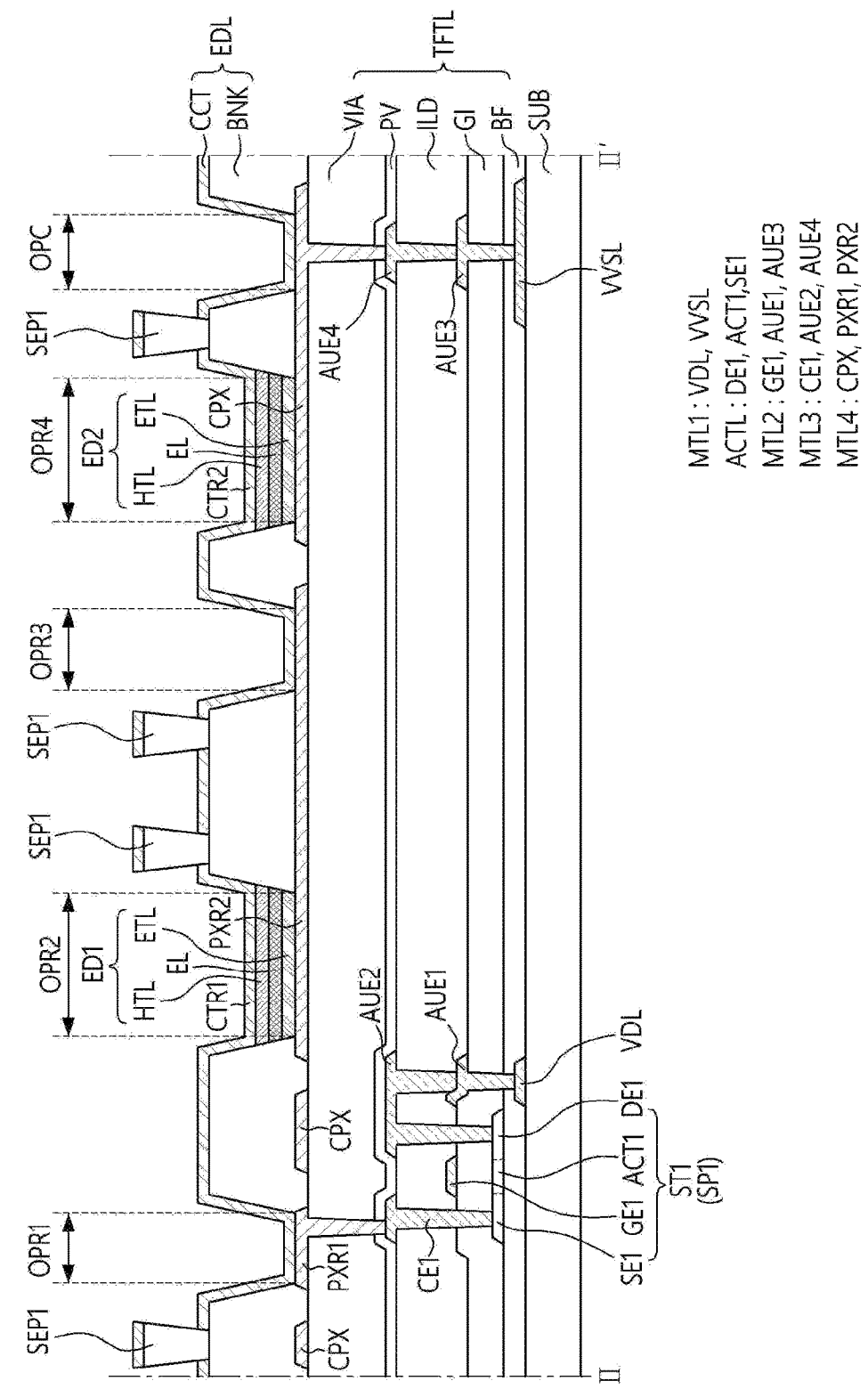
FIG. 7 is a schematic cross-sectional view taken along line II-II' of FIG. 6.
Figure 8:
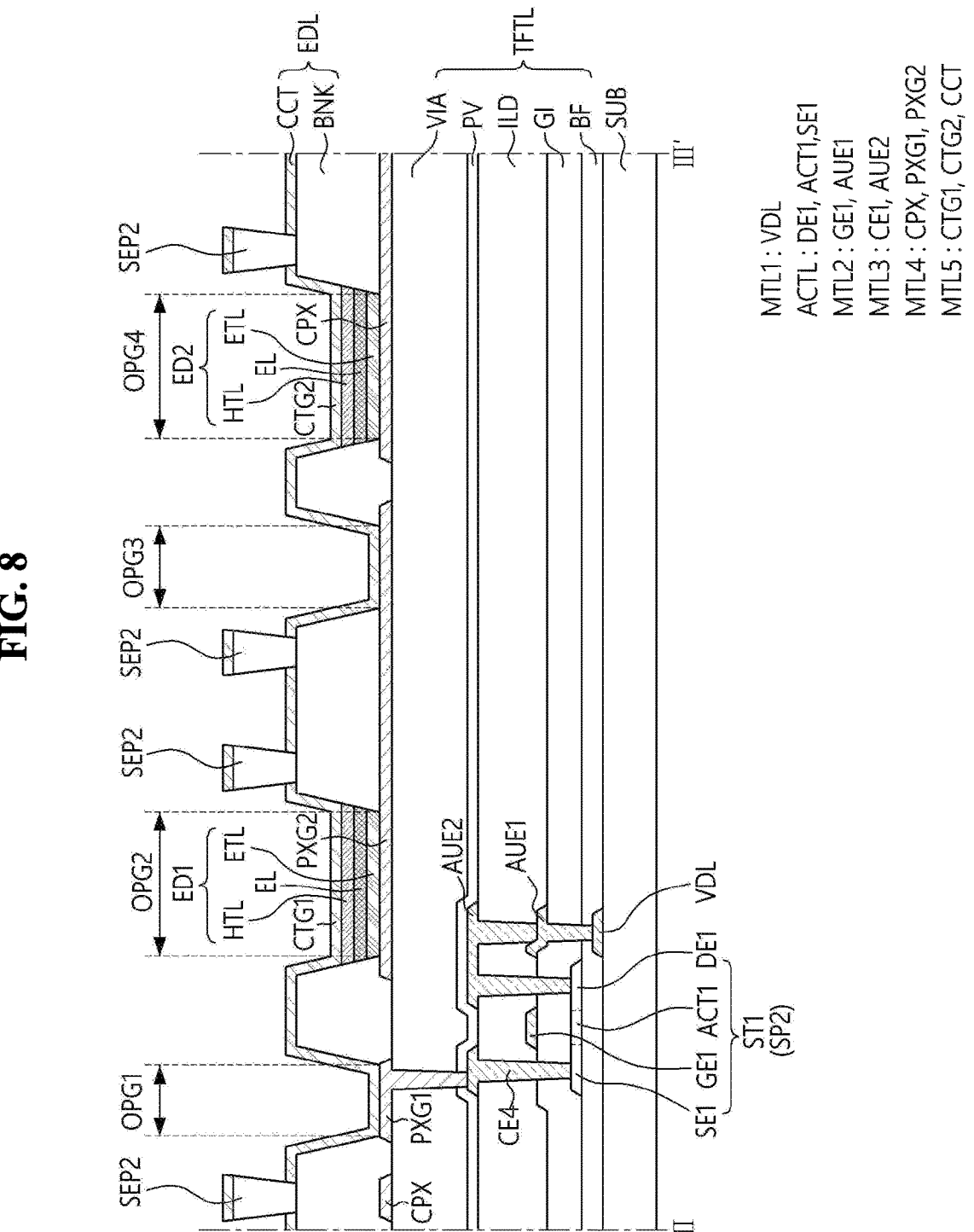
FIG. 8 is a schematic cross-sectional view taken along line III-III' of FIG. 6.
Figure 9:
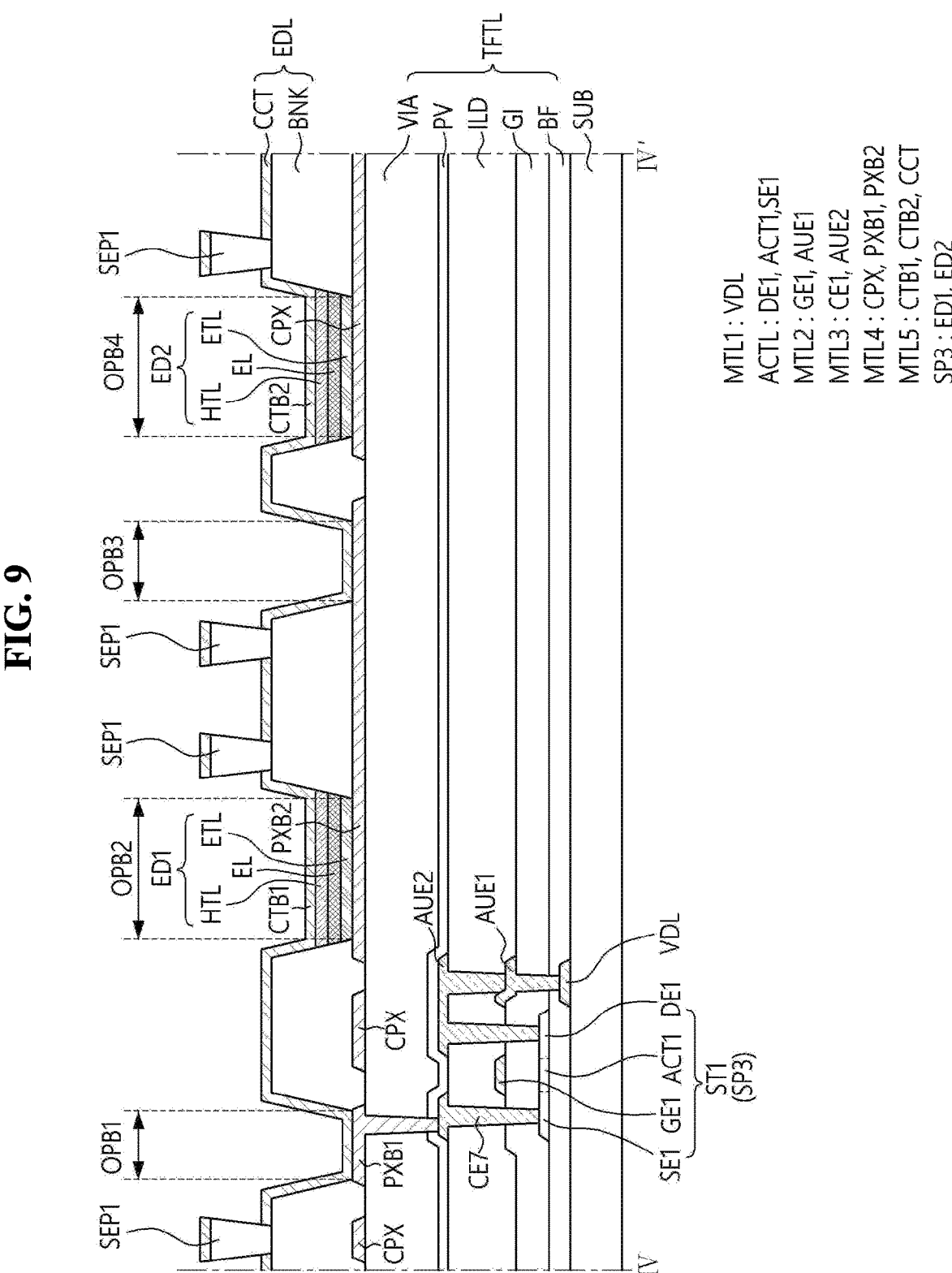
FIG. 9 is a schematic cross-sectional view taken along line IV-IV' of FIG. 6.

FIG. 6 is a schematic plan view illustrating a light emitting element layer of the display device according to an embodiment, and FIG. 7 is a schematic cross-sectional view taken along line II-II' of FIG. 6. FIG. 8 is a schematic cross-sectional view taken along line III-III' of FIG. 6, and FIG. 9 is a schematic cross-sectional view taken along line IV-IV' of FIG. 6. Hereinafter, a description of a thin film transistor layer TFTL is the same as that described with reference to FIGS. 4 and 5, and thus, the same/similar configuration as the above-described configuration will be briefly described or a description thereof will be omitted for descriptive convenience.

Referring to FIGS. 6 to 9, the display panel 100 may include a substrate SUB, a thin film transistor layer TFTL, and a light emitting element layer EDL.

The thin film transistor layer TFTL may be disposed on the substrate SUB. The thin film transistor layer TFTL may include a first metal layer MTL1, a buffer layer BF, an active layer ACTL, a gate insulating layer GI, a second metal layer MTL2, an interlayer insulating layer ILD, a third metal layer MTL3, a passivation layer PV, and a via layer VIA.

The first metal layer MTL1 may include the first voltage line VDL and the vertical voltage line VVSL.

The active layer ACTL may include the drain electrode DE 1, the active region ACT1, and the source electrode SE1 of the first transistor ST1 of each of the first to third pixels SP1, SP2, and SP3.

The second metal layer MTL2 may include the gate electrode GE1 of the first transistor ST1, the first auxiliary electrode AUE1, and the third auxiliary electrode AUE3.

The third metal layer MTL3 may include the first connection electrode CE1, the second auxiliary electrode AUE2, and the fourth auxiliary electrode AUE4.

The light emitting element layer EDL may be disposed on the thin film transistor layer TFTL. The light emitting element layer EDL may include a fourth metal layer MTL4, a bank BNK, an electron transport layer ETL, a light emitting layer EL, a hole transport layer HTL, first and second separation parts SEP1 and SEP2, and a fifth metal layer MTL5.

The fourth metal layer MTL4 may be disposed on the via layer VIA of the thin film transistor layer TFTL. The fourth metal layer MTL4 may include a first pixel electrode PXR1 and a second pixel electrode PXR2 of the first pixel SP1, a first pixel electrode PXG1 and a second pixel electrode PXG2 of the second pixel SP2, a first pixel electrode PXB1 and a second pixel electrode PXB2 of the third pixel SP3, and a common pixel electrode CPX.

The bank BNK may be disposed on the via layer VIA of the thin film transistor layer TFTL and the fourth metal layer MTL4. The bank BNK may electrically insulate the fourth metal layer MTL4. The bank BNK may include a plurality of open parts. The fourth metal layer MTL4 and the fifth metal layer MTL5 may be in contact with each other through some of the plurality of open parts, and the others of the plurality of open parts may correspond to emission areas in which the light emitting elements ED are disposed.

The first and second separation parts SEP1 and SEP2 may be disposed on an upper surface of the bank BNK. The fifth metal layer MTL5 may be formed on the entire surface of the display area DA by a single process and may be separated by the first and second separation parts SEP1 and SEP2. The first separation part SEP1 may surround a first open part OPR1 and a second open part OPR2 of the first pixel SP1. The first separation part SEP1 may surround a third open part OPR3 and a fourth open part OPR4 of the first pixel SP1. The first separation part SEP1 may surround a first open part OPB1 and a second open part OPB2 of the third pixel SP3. The first separation part SEP1 may surround a third open part OPB3 and a fourth open part OPB4 of the third pixel SP3. The second separation part SEP2 may surround a first open part OPG1 and a second open part OPG2 of the second pixel SP2. The second separation part SEP2 may surround a third open part OPG3 and a fourth open part OPG4 of the second pixel SP2.

For example, the first separation part SEP1 may separate and insulate a first contact electrode CTR1 and a second contact electrode CTR2 of the first pixel SP1, a first contact electrode CTB1 and a second contact electrode CTB2 of the third pixel SP3, and a common cathode electrode CCT from each other. The second separation part SEP2 may separate and insulate a first contact electrode CTG1 and a second contact electrode CTG2 of the second pixel SP2 and the common cathode electrode CCT from each other.

The fifth metal layer MTL5 may be disposed on the fourth metal layer MTL4, the hole transport layer HTL, the bank BNK, and the first and second separation parts SEP1 and SEP2. The fifth metal layer MTL5 may include the first contact electrode CTR1 and the second contact electrode CTR2 of the first pixel SP1, the first contact electrode CTG1 and the second contact electrode CTG2 of the second pixel SP2, the first contact electrode CTB1 and the second contact electrode CTB2 of the third pixel SP3, and the common cathode electrode CCT.

In FIGS. 6 and 7, the first pixel electrode PXR1 of the first pixel SP1 may overlap the first open part OPR1 of the first pixel SP1. The first pixel electrode PXR1 of the first pixel SP1 may be electrically connected to the pixel circuit of the first pixel SP1. The first pixel electrode PXR1 of the first pixel SP1 may be electrically connected to the source electrode SE1 of the first transistor ST1 through the first connection electrode CE1. The first pixel electrode PXR1 of the first pixel SP1 may be connected to the first contact electrode CTR1 through the first open part OPR1.

The first contact electrode CTR1 of the first pixel SP1 may be disposed on the first open part OPR1 and the second open part OPR2 of the first pixel SP1. The first contact electrode CTR1 may correspond to a first electrode of the first light emitting element ED1.

The first light emitting element ED1 of the first pixel SP1 may be disposed in the second open part OPR2 of the first pixel SP1. The first light emitting element ED1 may include the first electrode, a hole transport layer HTL, a light emitting layer EL, an electron transport layer ETL, and a second electrode. The first electrode of the first light emitting element ED1 may be the first contact electrode CTR1, and the second electrode of the first light emitting element ED1 may be the second pixel electrode PXR2. Accordingly, the first contact electrode CTR1 may be an anode electrode of the first light emitting element ED1, and the second pixel electrode PXR2 may be a cathode electrode of the first light emitting element ED1.

The electron transport layer ETL of the first light emitting element ED1 may be disposed on the second pixel electrode PXR2, and the light emitting layer EL of the first light emitting element ED1 may be disposed on the electron transport layer ETL. The hole transport layer HTL may be disposed on the light emitting layer EL, and the first contact electrode CTR1 may be disposed on the hole transport layer HTL. For example, the light emitting layer EL may be an organic light emitting layer including an organic material. In case that the first contact electrode CTR1 receives the driving current through the pixel circuit of the first pixel SP1, holes may move to the light emitting layer EL through the hole transport layer HTL and electrons may move to the light emitting layer EL through the electron transport layer ETL. The holes and the electrons may be combined with each other in the light emitting layer EL to emit light.

The second pixel electrode PXR2 of the first pixel SP1 may overlap the second open part OPR2 and the third open part OPR3 of the first pixel SP1. The second open part OPR2 and the third open part OPR3 may be spaced apart from each other with the first separation part SEP1 interposed between the second open part OPR2 and the third open part OPR3. The second pixel electrode PXR2 of the first pixel SP1 may correspond to the second electrode of the first light emitting element ED1, and may be connected to the second contact electrode CTR2 of the first pixel SP1 through the third open part OPR3.

The second contact electrode CTR2 of the first pixel SP1 may be disposed on the third open part OPR3 and the fourth open part OPR4 of the first pixel SP1. The second contact electrode CTR2 may correspond to a first electrode of the second light emitting element ED2.

The second light emitting element ED2 of the first pixel SP1 may be disposed in the fourth open part OPR4 of the first pixel SP1. The second light emitting element ED2 may include the first electrode, a hole transport layer HTL, a light emitting layer EL, an electron transport layer ETL, and a second electrode. The first electrode of the second light emitting element ED2 may be the second contact electrode CTR2, and the second electrode of the second light emitting element ED2 may be the common pixel electrode CPX. Accordingly, the second contact electrode CTR2 may be an anode electrode of the second light emitting element ED2, and the common pixel electrode CPX may be a cathode electrode of the second light emitting element ED2.

The electron transport layer ETL of the second light emitting element ED2 may be disposed on the common pixel electrode CPX, and the light emitting layer EL of the second light emitting element ED2 may be disposed on the electron transport layer ETL. The hole transport layer HTL may be disposed on the light emitting layer EL, and the second contact electrode CTR2 may be disposed on the hole transport layer HTL. For example, the light emitting layer EL may be an organic light emitting layer including an organic material. In case that the second contact electrode CTR2 receives the driving current flowing through the first light emitting element ED1, holes may move to the light emitting layer EL through the hole transport layer HTL and electrons may move to the light emitting layer EL through the electron transport layer ETL. The holes and the electrons may be combined with each other in the light emitting layer EL to emit light.

The common pixel electrode CPX may overlap the fourth open part OPR4 of the first pixel SP1, the fourth open part OPG4 of the second pixel SP2, the fourth open part OPB4 of the third pixel SP3, and a power open part OPC. The fourth open part OPR4 of the first pixel SP1 and the power open part OPC may be spaced apart from each other with the first separation part SEP1 interposed between the fourth open part OPR4 of the first pixel SP1 and the power open part OPC. The common pixel electrode CPX may be electrically connected to the vertical voltage line VVSL through the third and fourth auxiliary electrodes AUE3 and AUE4. Accordingly, the common pixel electrode CPX may receive the low potential voltage from the vertical voltage line VVSL.

The display device 10 may increase luminous efficiency and decrease a magnitude of the driving current as compared with a case where one light emitting element is included by supplying the driving current of the first pixel SP1 to the first and second light emitting elements ED1 and ED2 disposed at/on (or formed as) the same layer and connected to each other in series. Accordingly, the display device 10 may decrease power consumption.

In FIGS. 6 and 8, the first pixel electrode PXG1 of the second pixel SP2 may overlap the first open part OPG1 of the second pixel SP2. The first pixel electrode PXG1 of the second pixel SP2 may be electrically connected to the pixel circuit of the second pixel SP2. The first pixel electrode PXG1 of the second pixel SP2 may be electrically connected to the source electrode SE1 of the first transistor ST1 through the fourth connection electrode CE4. The first pixel electrode PXG1 of the second pixel SP2 may be connected to the first contact electrode CTG1 through the first open part OPG1.

The first contact electrode CTG1 of the second pixel SP2 may be disposed on the first open part OPG1 and the second open part OPG2 of the second pixel SP2. The first contact electrode CTG1 may correspond to a first electrode of the first light emitting element ED1.

The first light emitting element ED1 of the second pixel SP2 may be disposed in the second open part OPG2 of the second pixel SP2. The first light emitting element ED1 may include the first electrode, a hole transport layer HTL, a light emitting layer EL, an electron transport layer ETL, and a second electrode. The first electrode of the first light emitting element ED1 may be the first contact electrode CTG1, and the second electrode of the first light emitting element ED1 may be the second pixel electrode PXG2. Accordingly, the first contact electrode CTG1 may be an anode electrode of the first light emitting element ED1, and the second pixel electrode PXG2 may be a cathode electrode of the first light emitting element ED1.

The electron transport layer ETL of the first light emitting element ED1 may be disposed on the second pixel electrode PXG2, and the light emitting layer EL of the first light emitting element ED1 may be disposed on the electron transport layer ETL. The hole transport layer HTL may be disposed on the light emitting layer EL, and the first contact electrode CTG1 may be disposed on the hole transport layer HTL. For example, the light emitting layer EL may be an organic light emitting layer including an organic material. In case that the first contact electrode CTG1 receives the driving current through the pixel circuit of the second pixel SP2, holes may move to the light emitting layer EL through the hole transport layer HTL and electrons may move to the light emitting layer EL through the electron transport layer ETL. The holes and the electrons may be combined with each other in the light emitting layer EL to emit light.

The second pixel electrode PXG2 of the second pixel SP2 may overlap the second open part OPG2 and the third open part OPG3 of the second pixel SP2. The second open part OPG2 and the third open part OPG3 may be spaced apart from each other with the second separation part SEP2 interposed between the second open part OPG2 and the third open part OPG3. The second pixel electrode PXG2 of the second pixel SP2 may correspond to the second electrode of the first light emitting element ED1, and may be connected to the second contact electrode CTG2 of the second pixel SP2 through the third open part OPG3.

The second contact electrode CTG2 of the second pixel SP2 may be disposed on the third open part OPG3 and the fourth open part OPG4 of the second pixel SP2. The second contact electrode CTG2 may correspond to a first electrode of the second light emitting element ED2.

The second light emitting element ED2 of the second pixel SP2 may be disposed in the fourth open part OPG4 of the second pixel SP2. The second light emitting element ED2 may include the first electrode, a hole transport layer HTL, a light emitting layer EL, an electron transport layer ETL, and a second electrode. The first electrode of the second light emitting element ED2 may be the second contact electrode CTG2, and the second electrode of the second light emitting element ED2 may be the common pixel electrode CPX. Accordingly, the second contact electrode CTG2 may be an anode electrode of the second light emitting element ED2, and the common pixel electrode CPX may be a cathode electrode of the second light emitting element ED2.

The electron transport layer ETL of the second light emitting element ED2 may be disposed on the common pixel electrode CPX, and the light emitting layer EL of the second light emitting element ED2 may be disposed on the electron transport layer ETL. The hole transport layer HTL may be disposed on the light emitting layer EL, and the second contact electrode CTG2 may be disposed on the hole transport layer HTL. For example, the light emitting layer EL may be an organic light emitting layer including an organic material. In case that the second contact electrode CTG2 receives the driving current flowing through the first light emitting element ED1, holes may move to the light emitting layer EL through the hole transport layer HTL and electrons may move to the light emitting layer EL through the electron transport layer ETL. The holes and the electrons may be combined with each other in the light emitting layer EL to emit light.

The common pixel electrode CPX may overlap the fourth open part OPR4 of the first pixel SP1, the fourth open part OPG4 of the second pixel SP2, the fourth open part OPB4 of the third pixel SP3, and the power open part OPC. The fourth open part OPG4 of the second pixel SP2 and the power open part OPC may be spaced apart from each other with the second separation part SEP2 interposed between the fourth open part OPG4 of the second pixel SP2 and the power open part OPC. The common pixel electrode CPX may be electrically connected to the vertical voltage line VVSL through the third and fourth auxiliary electrodes AUE3 and AUE4. Accordingly, the common pixel electrode CPX may receive the low potential voltage from the vertical voltage line VVSL.

The display device 10 may increase luminous efficiency and decrease a magnitude of the driving current as compared with a case where one light emitting element is included by supplying the driving current of the second pixel SP2 to the first and second light emitting elements ED1 and ED2 disposed at/on (or formed as) the same layer and connected to each other in series. Accordingly, the display device 10 may decrease power consumption.

In FIGS. 6 and 9, the first pixel electrode PXB1 of the third pixel SP3 may overlap the first open part OPB1 of the third pixel SP3. The first pixel electrode PXB1 of the third pixel SP3 may be electrically connected to the pixel circuit of the third pixel SP3. The first pixel electrode PXB1 of the third pixel SP3 may be electrically connected to the source electrode SE1 of the first transistor ST1 through the seventh connection electrode CE7. The first pixel electrode PXB1 of the third pixel SP3 may be connected to the first contact electrode CTB1 through the first open part OPB1.

The first contact electrode CTB1 of the third pixel SP3 may be disposed on the first open part OPB1 and the second open part OPB2 of the third pixel SP3. The first contact electrode CTB1 may correspond to a first electrode of the first light emitting element ED1.

The first light emitting element ED1 of the third pixel SP3 may be disposed in the second open part OPB2 of the third pixel SP3. The first light emitting element ED1 may include the first electrode, a hole transport layer HTL, a light emitting layer EL, an electron transport layer ETL, and a second electrode. The first electrode of the first light emitting element ED1 may be the first contact electrode CTB1, and the second electrode of the first light emitting element ED1 may be the second pixel electrode PXB2. Accordingly, the first contact electrode CTB1 may be an anode electrode of the first light emitting element ED1, and the second pixel electrode PXB2 may be a cathode electrode of the first light emitting element ED1.

The electron transport layer ETL of the first light emitting element ED1 may be disposed on the second pixel electrode PXB2, and the light emitting layer EL of the first light emitting element ED1 may be disposed on the electron transport layer ETL. The hole transport layer HTL may be disposed on the light emitting layer EL, and the first contact electrode CTB1 may be disposed on the hole transport layer HTL. For example, the light emitting layer EL may be an organic light emitting layer including an organic material. In case that the first contact electrode CTB1 receives the driving current through the pixel circuit of the third pixel SP3, holes may move to the light emitting layer EL through the hole transport layer HTL and electrons may move to the light emitting layer EL through the electron transport layer ETL. The holes and the electrons may be combined with each other in the light emitting layer EL to emit light.

The second pixel electrode PXB2 of the third pixel SP3 may overlap the second open part OPB2 and the third open part OPB3 of the third pixel SP3. The second open part OPB2 and the third open part OPB3 may be spaced apart from each other with the first separation part SEP1 interposed between the second open part OPB2 and the third open part OPB3. The second pixel electrode PXB2 of the third pixel SP3 may correspond to the second electrode of the first light emitting element ED1, and may be connected to the second contact electrode CTB2 of the third pixel SP3 through the third open part OPB3.

The second contact electrode CTB2 of the third pixel SP3 may be disposed on the third open part OPB3 and the fourth open part OPB4 of the third pixel SP3. The second contact electrode CTB2 may correspond to a first electrode of the second light emitting element ED2.

The second light emitting element ED2 of the third pixel SP3 may be disposed in the fourth open part OPB4 of the third pixel SP3. The second light emitting element ED2 may include the first electrode, a hole transport layer HTL, a light emitting layer EL, an electron transport layer ETL, and a second electrode. The first electrode of the second light emitting element ED2 may be the second contact electrode CTB2, and the second electrode of the second light emitting element ED2 may be the common pixel electrode CPX. Accordingly, the second contact electrode CTB2 may be an anode electrode of the second light emitting element ED2, and the common pixel electrode CPX may be a cathode electrode of the second light emitting element ED2.

The electron transport layer ETL of the second light emitting element ED2 may be disposed on the common pixel electrode CPX, and the light emitting layer EL of the second light emitting element ED2 may be disposed on the electron transport layer ETL. The hole transport layer HTL may be disposed on the light emitting layer EL, and the second contact electrode CTB2 may be disposed on the hole transport layer HTL. For example, the light emitting layer EL may be an organic light emitting layer including an organic material. In case that the second contact electrode CTB2 receives the driving current flowing through the first light emitting element ED1, holes may move to the light emitting layer EL through the hole transport layer HTL and electrons may move to the light emitting layer EL through the electron transport layer ETL. The holes and the electrons may be combined with each other in the light emitting layer EL to emit light.

The common pixel electrode CPX may overlap the fourth open part OPR4 of the first pixel SP1, the fourth open part OPG4 of the second pixel SP2, the fourth open part OPB4 of the third pixel SP3, and the power open part OPC. The fourth open part OPB4 of the third pixel SP3 and the power open part OPC may be spaced apart from each other with the first separation part SEP1 interposed between the fourth open part OPB4 of the third pixel SP3 and the power open part OPC. The common pixel electrode CPX may be electrically connected to the vertical voltage line VVSL through the third and fourth auxiliary electrodes AUE3 and AUE4. Accordingly, the common pixel electrode CPX may receive the low potential voltage from the vertical voltage line VVSL.

The display device 10 may increase luminous efficiency and decrease a magnitude of the driving current as compared with a case where one light emitting element is included by supplying the driving current of the third pixel SP3 to the first and second light emitting elements ED1 and ED2 disposed at/on (or formed as) the same layer and connected to each other in series. Accordingly, the display device 10 may decrease power consumption.

Figure 10:
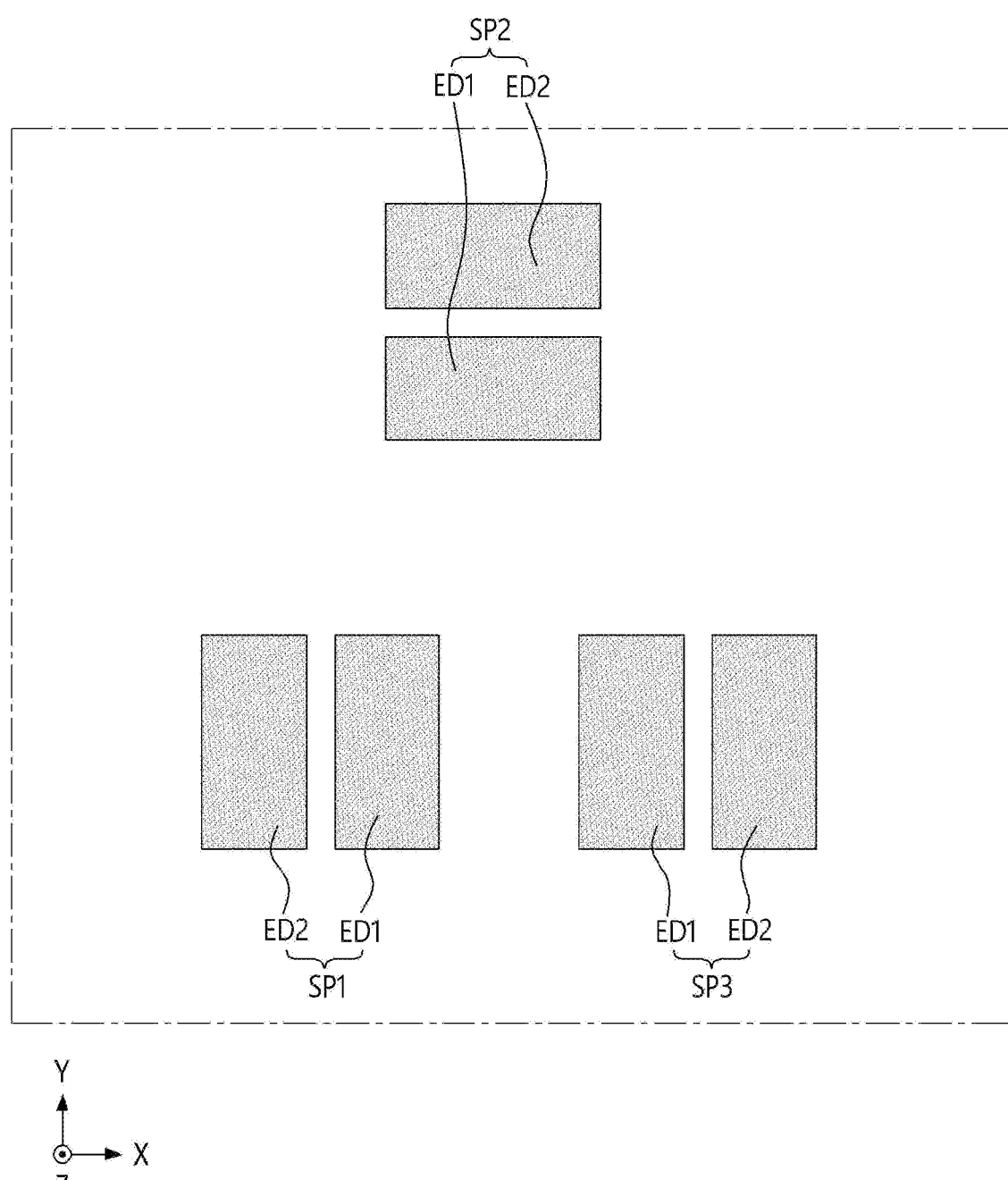
FIG. 10 is a schematic plan view illustrating an example of an arrangement of light emitting elements in the display device according to an embodiment.

FIG. 10 is a schematic plan view illustrating an example of an arrangement of light emitting elements in the display device according to an embodiment. The arrangement of the light emitting elements of FIG. 10 may be substantially the same as the arrangement of the light emitting elements of FIG. 6.

Referring to FIG. 10, the first light emitting element ED1 of the first pixel SP1 may be disposed in the second open part OPR2 of the first pixel SP1, and the second light emitting element ED2 of the first pixel SP1 may be disposed in the fourth open part OPR4 of the first pixel SP1. Accordingly, an arrangement of the first and second light emitting elements ED1 and ED2 of the first pixel SP1 may be determined according to shapes of the second open part OPR2 and the fourth open part OPR4.

The first light emitting element ED1 of the second pixel SP2 may be disposed in the second open part OPG2 of the second pixel SP2, and the second light emitting element ED2 of the second pixel SP2 may be disposed in the fourth open part OPG4 of the second pixel SP2. Accordingly, an arrangement of the first and second light emitting elements ED1 and ED2 of the second pixel SP2 may be determined according to shapes of the second open part OPG2 and the fourth open part OPG4.

The first light emitting element ED1 of the third pixel SP3 may be disposed in the second open part OPB2 of the third pixel SP3, and the second light emitting element ED2 of the third pixel SP3 may be disposed in the fourth open part OPB4 of the third pixel SP3. Accordingly, an arrangement of the first and second light emitting elements ED1 and ED2 of the third pixel SP3 may be determined according to shapes of the second open part OPB2 and the fourth open part OPB4.

The first and second light emitting elements ED1 and ED2 of the first pixel SP1 may include short sides in the first direction (e.g., X-axis direction) and long sides in the second direction (e.g., Y-axis direction). The first light emitting element ED1 may be disposed on the right side of the second light emitting element ED2.

The first and second light emitting elements ED1 and ED2 of the second pixel SP2 may include long sides in the first direction (e.g., X-axis direction) and short sides in the second direction (e.g., Y-axis direction). The first light emitting element ED1 may be disposed on the lower side of the second light emitting element ED2.

The first and second light emitting elements ED1 and ED2 of the third pixel SP3 may include short sides in the first direction (e.g., X-axis direction) and long sides in the second direction (e.g., Y-axis direction). The first light emitting element ED1 may be disposed on the left side of the second light emitting element ED2.

Figure 11:
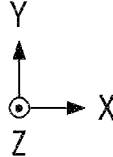
FIG. 11 is a schematic plan view illustrating another example of an arrangement of light emitting elements in the display device according to an embodiment.

FIG. 11 is a schematic plan view illustrating another example of an arrangement of light emitting elements in the display device according to an embodiment.

Referring to FIG. 11, the first and second light emitting elements ED1 and ED2 of the first pixel SP1 may include short sides in the first direction (e.g., X-axis direction) and long sides in the second direction (e.g., Y-axis direction). The first light emitting element ED1 may be disposed on the right side of the second light emitting element ED2.

The first and second light emitting elements ED1 and ED2 of the second pixel SP2 may include short sides in the first direction (e.g., X-axis direction) and long sides in the second direction (e.g., Y-axis direction). The first light emitting element ED1 may be disposed on the right side of the second light emitting element ED2.

The first and second light emitting elements ED1 and ED2 of the third pixel SP3 may include short sides in the first direction (e.g., X-axis direction) and long sides in the second direction (e.g., Y-axis direction). The first light emitting element ED1 may be disposed on the left side of the second light emitting element ED2.

Figure 12:
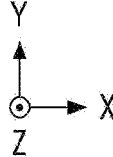
FIG. 12 is a schematic plan view illustrating still another example of an arrangement of light emitting elements in the display device according to an embodiment.

FIG. 12 is a schematic plan view illustrating still another example of an arrangement of light emitting elements in the display device according to an embodiment.

Referring to FIG. 12, the first and second light emitting elements ED1 and ED2 of the first pixel SP1 may include long sides in the first direction (e.g., X-axis direction) and short sides in the second direction (e.g., Y-axis direction). The first light emitting element ED1 may be disposed on the upper side of the second light emitting element ED2.

The first and second light emitting elements ED1 and ED2 of the second pixel SP2 may include long sides in the first direction (e.g., X-axis direction) and short sides in the second direction (e.g., Y-axis direction). The first light emitting element ED1 may be disposed on the lower side of the second light emitting element ED2.

The first and second light emitting elements ED1 and ED2 of the third pixel SP3 may include long sides in the first direction (e.g., X-axis direction) and short sides in the second direction (e.g., Y-axis direction). The first light emitting element ED1 may be disposed on the lower side of the second light emitting element ED2.

Figure 13:
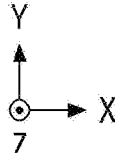
FIG. 13 is a schematic plan view illustrating still another example of an arrangement of light emitting elements in the display device according to an embodiment.

FIG. 13 is a schematic plan view illustrating still another example of an arrangement of light emitting elements in the display device according to an embodiment.

Referring to FIG. 13, the first and second light emitting elements ED1 and ED2 of the first pixel SP1 may include long sides in the first direction (e.g., X-axis direction) and short sides in the second direction (e.g., Y-axis direction). The first light emitting element ED1 may be disposed on the upper side of the second light emitting element ED2.

The first and second light emitting elements ED1 and ED2 of the second pixel SP2 may include long sides in the first direction (e.g., X-axis direction) and short sides in the second direction (e.g., Y-axis direction). The first light emitting element ED1 may be disposed on the lower side of the second light emitting element ED2.

The first and second light emitting elements ED1 and ED2 of the third pixel SP3 may include short sides in the first direction (e.g., X-axis direction) and long sides in the second direction (e.g., Y-axis direction). The first light emitting element ED1 may be disposed on the left side of the second light emitting element ED2.

Figure 14:
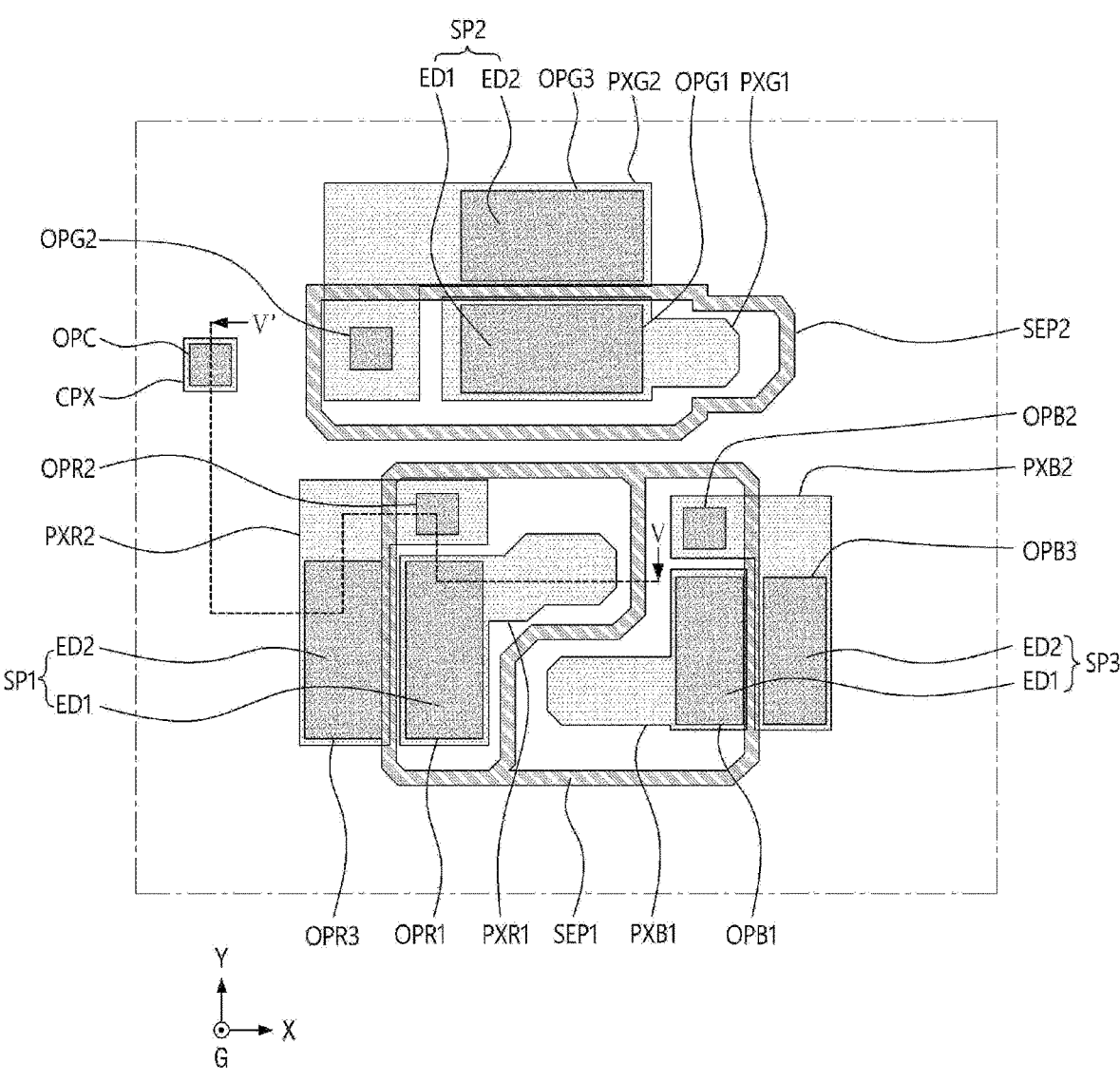
FIG. 14 is a schematic plan view illustrating a light emitting element layer of a display device according to another embodiment.
Figure 15:
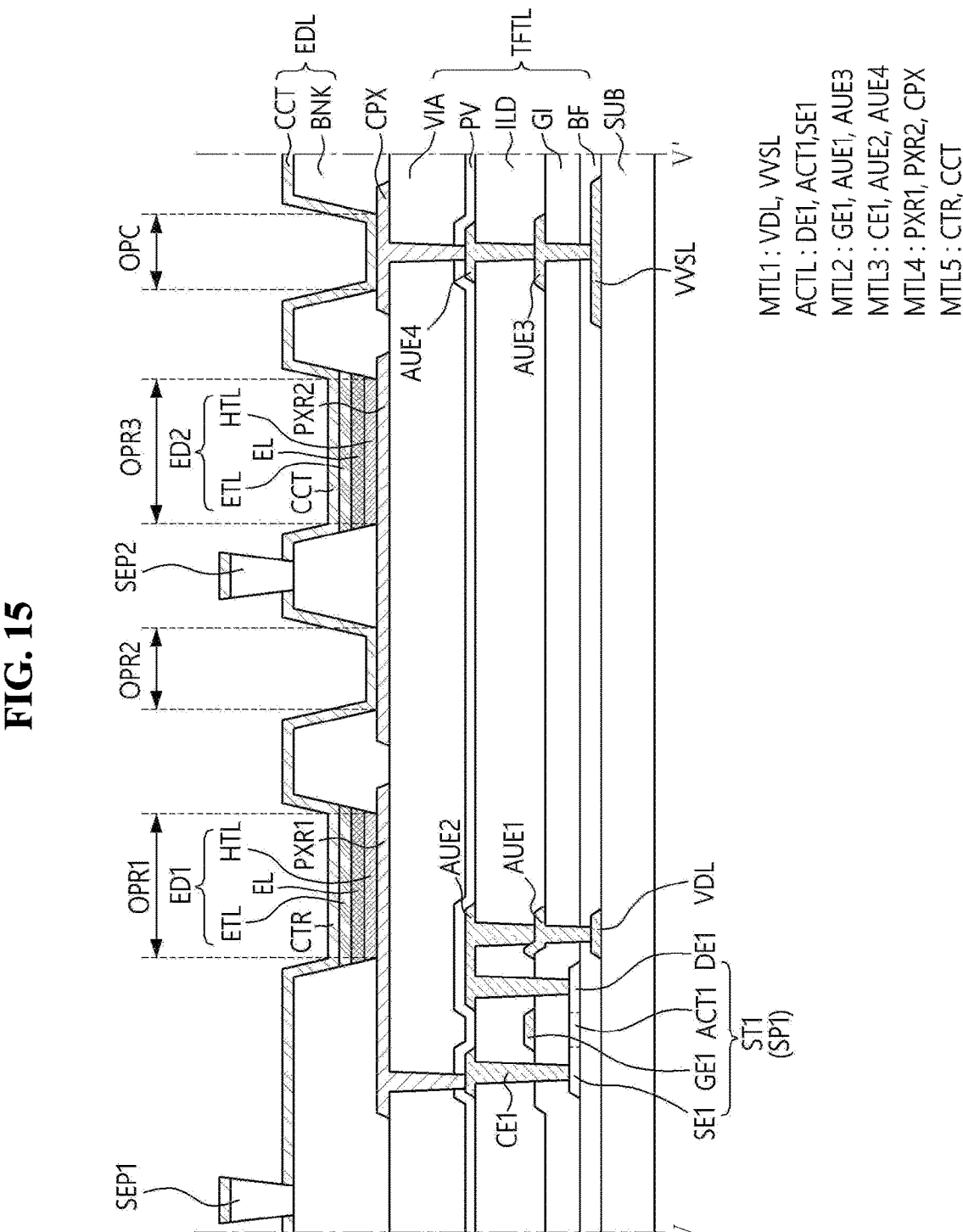
FIG. 15 is a schematic cross-sectional view taken along line V-V' of FIG. 14.

FIG. 14 is a schematic plan view illustrating a light emitting element layer of a display device according to another embodiment, and FIG. 15 is a schematic cross-sectional view taken along line V-V' of FIG. 14. Hereinafter, the same/similar configuration as the above-described configuration will be briefly described or a description thereof will be omitted for descriptive convenience.

Referring to FIGS. 14 and 15, the display panel 100 may include a substrate SUB, a thin film transistor layer TFTL, and a light emitting element layer EDL.

The light emitting element layer EDL may be disposed on the thin film transistor layer TFTL. The light emitting element layer EDL may include a fourth metal layer MTL4, a bank BNK, a hole transport layer HTL, a light emitting layer EL, an electron transport layer ETL, first and second separation parts SEP1 and SEP2, and a fifth metal layer MTL5.

The fourth metal layer MTL4 may be disposed on the via layer VIA of the thin film transistor layer TFTL. The fourth metal layer MTL4 may include a first pixel electrode PXR1 and a second pixel electrode PXR2 of the first pixel SP1, a first pixel electrode PXG1 and a second pixel electrode PXG2 of the second pixel SP2, a first pixel electrode PXB1 and a second pixel electrode PXB2 of the third pixel SP3, and a common pixel electrode CPX.

The bank BNK may be disposed on the via layer VIA of the thin film transistor layer TFTL and the fourth metal layer MTL4. The bank BNK may electrically insulate the fourth metal layer MTL4. The bank BNK may include a plurality of open parts. The fourth metal layer MTL4 and the fifth metal layer MTL5 may be in contact with each other through some of the plurality of open parts, and the others of the plurality of open parts may correspond to emission areas in which the light emitting elements ED are disposed.

The first and second separation parts SEP1 and SEP2 may be disposed on an upper surface of the bank BNK. The fifth metal layer MTL5 may be formed on the entire surface of the display area DA by a single process and may be separated by the first and second separation parts SEP1 and SEP2. The first separation part SEP1 may surround a first open part OPR1 and a second open part OPR2 of the first pixel SP1. The first separation part SEP1 may surround a first open part OPB1 and a second open part OPB2 of the third pixel SP3. The second separation part SEP2 may surround a first open part OPG1 and a second open part OPG2 of the second pixel SP2.

For example, the first separation part SEP1 may separate a contact electrode CTR of the first pixel SP1, a contact electrode of the third pixel SP3, and a common cathode electrode CCT from each other. The second separation part SEP2 may separate a contact electrode of the second pixel SP2 and the common cathode electrode CCT from each other.

The fifth metal layer MTL5 may be disposed on the fourth metal layer MTL4, the electron transport layer ETL, the bank BNK, and the first and second separation parts SEP1 and SEP2. The fifth metal layer MTL5 may include the contact electrode CTR of the first pixel SP1, the contact electrode of the second pixel SP2, the contact electrode of the third pixel SP3, and the common cathode electrode CCT.

The first pixel electrode PXR1 of the first pixel SP1 may overlap the first open part OPR1 of the first pixel SP1. The first pixel electrode PXR1 of the first pixel SP1 may be electrically connected to the pixel circuit of the first pixel SP1. The first pixel electrode PXR1 of the first pixel SP1 may be electrically connected to the source electrode SE1 of the first transistor ST1 through the first connection electrode CE1.

The first light emitting element ED1 of the first pixel SP1 may be disposed in the first open part OPR1 of the first pixel SP1. The first light emitting element ED1 may include a first electrode, a hole transport layer HTL, a light emitting layer EL, an electron transport layer ETL, and a second electrode. The first electrode of the first light emitting element ED1 may be the first pixel electrode PXR1, and the second electrode of the first light emitting element ED1 may be the contact electrode CTR. Accordingly, the first pixel electrode PXR1 may be an anode electrode of the first light emitting element ED1, and the contact electrode CTR may be a cathode electrode of the first light emitting element ED1.

The hole transport layer HTL of the first light emitting element ED1 may be disposed on the first pixel electrode PXR1, and the light emitting layer EL of the first light emitting element ED1 may be disposed on the hole transport layer HTL. The electron transport layer ETL may be disposed on the light emitting layer EL, and the contact electrode CTR may be disposed on the electron transport layer ETL. For example, the light emitting layer EL may be an organic light emitting layer including an organic material. In case that the first pixel electrode PXR1 receives the driving current through the pixel circuit of the first pixel SP1, holes may move to the light emitting layer EL through the hole transport layer HTL and electrons may move to the light emitting layer EL through the electron transport layer ETL. The holes and the electrons may be combined with each other in the light emitting layer EL to emit light.

The contact electrode CTR of the first pixel SP1 may be disposed on the first open part OPR1 and the second open part OPR2 of the first pixel SP1. The contact electrode CTR may correspond to the second electrode of the first light emitting element ED1 and may be connected to the second pixel electrode PXR2 of the first pixel SP1 through the second open part OPR2.

The second pixel electrode PXR2 of the first pixel SP1 may overlap the second open part OPR2 and the third open part OPR3 of the first pixel SP1. The second open part OPR2 and the third open part OPR3 may be spaced apart from each other with the first separation part SEP1 interposed between the second open part OPR2 and the third open part OPR3. The second pixel electrode PXR2 of the first pixel SP1 may correspond to a first electrode of the second light emitting element ED2.

The second light emitting element ED2 of the first pixel SP1 may be disposed in the third open part OPR3 of the first pixel SP1. The second light emitting element ED2 may include the first electrode, a hole transport layer HTL, a light emitting layer EL, an electron transport layer ETL, and a second electrode. The first electrode of the second light emitting element ED2 may be the second pixel electrode PXR2, and the second electrode of the second light emitting element ED2 may be the common cathode electrode CCT. Accordingly, the second pixel electrode PXR2 may be an anode electrode of the second light emitting element ED2, and the common cathode electrode CCT may be a cathode electrode of the second light emitting element ED2.

The hole transport layer HTL of the second light emitting element ED2 may be disposed on the second pixel electrode PXR2, and the light emitting layer EL of the second light emitting element ED2 may be disposed on the hole transport layer HTL. The electron transport layer ETL may be disposed on the light emitting layer EL, and the common cathode electrode CCT may be disposed on the electron transport layer ETL. For example, the light emitting layer EL may be an organic light emitting layer including an organic material. In case that the second pixel electrode PXR2 receives the driving current flowing through the first light emitting element ED1, holes may move to the light emitting layer EL through the hole transport layer HTL and electrons may move to the light emitting layer EL through the electron transport layer ETL. The holes and the electrons may be combined with each other in the light emitting layer EL to emit light.

The common pixel electrode CPX may be spaced apart from the first pixel electrode PXR1 and the second pixel electrode PXR2 of the first pixel SP1, the first pixel electrode PXG1 and the second pixel electrode PXG2 of the second pixel SP2, and the first pixel electrode PXB1 and the second pixel electrode PXB2 of the third pixel SP3. The common pixel electrode CPX may overlap the power open part OPC. The common pixel electrode CPX may be connected to the common cathode electrode CCT through the power open part OPC.

The common pixel electrode CPX may be electrically connected to the vertical voltage line VVSL through the third and fourth auxiliary electrodes AUE3 and AUE4. Accordingly, the common pixel electrode CPX may receive the low potential voltage from the vertical voltage line VVSL.

The display device 10 may increase luminous efficiency and decrease a magnitude of the driving current as compared with a case where one light emitting element is included by supplying the driving current of the first pixel SP1 to the first and second light emitting elements ED1 and ED2 disposed at/on (or formed as) the same layer and connected to each other in series. Accordingly, the display device 10 may decrease power consumption.

The first and second light emitting elements ED1 and ED2 of each of the second and third pixels SP2 and SP3 may be formed in the same manner as the first and second light emitting elements ED1 and ED2 of the first pixel SP1 illustrated in FIG. 15.

Figure 16:
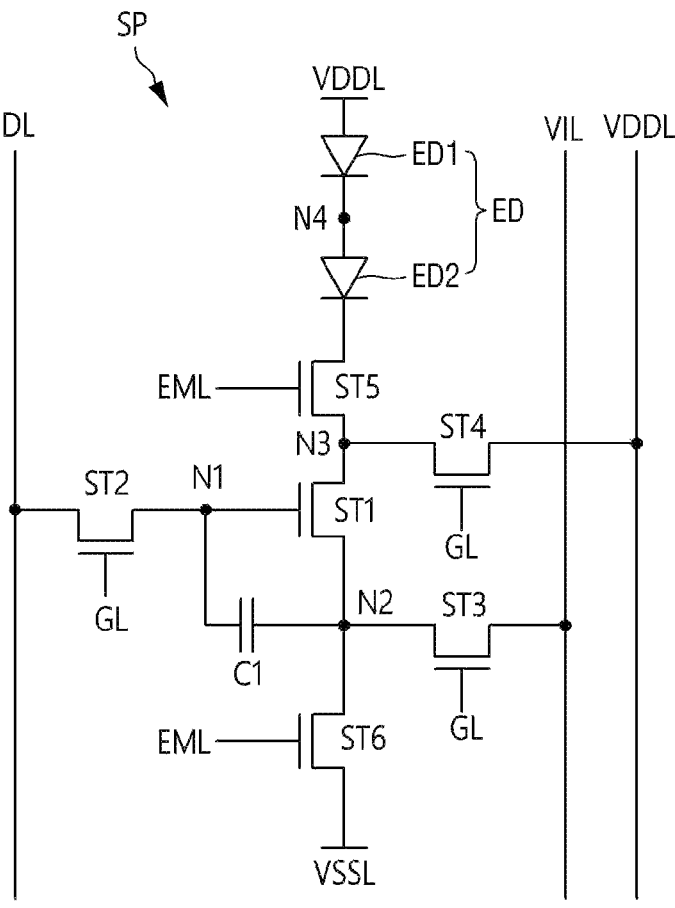
FIG. 16 is a schematic diagram of an equivalent circuit illustrating a pixel of a display device according to still another embodiment.

FIG. 16 is a schematic diagram of an equivalent circuit illustrating a pixel of a display device according to still another embodiment.

Referring to FIG. 16, each of the pixels SP may be connected to a driving voltage line VDDL, a data line DL, an initialization voltage line VIL, a gate line GL, an emission control line EML, and a low potential line VSSL.

The pixel SP may include a pixel circuit and a light emitting element ED. The pixel circuit of the pixel SP may include first to sixth transistors ST1, ST2, ST3, ST4, ST5, and ST6 and a first capacitor C1.

The first transistor ST1 may include a gate electrode, a drain electrode, and a source electrode. The gate electrode of the first transistor ST1 may be connected to a first node N1, the drain electrode of the first transistor ST1 may be connected to a third node N3, and the source electrode of the first transistor ST1 may be connected to a second node N2. The first transistor ST1 may control a drain-source current (or a driving current) based on a data voltage applied to the gate electrode.

The second transistor ST2 may be turned on by a gate signal of the gate line GL to electrically connect the data line DL and the first node N1, which is the gate electrode of the first transistor ST1, to each other. The second transistor ST2 may be turned on based on the gate signal to supply a data voltage to the first node N1. A gate electrode of the second transistor ST2 may be connected to the gate line GL, a drain electrode of the second transistor ST2 may be connected to the data line DL, and a source electrode of the second transistor ST2 may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by a gate signal of the gate line GL to electrically connect the initialization voltage line VIL and the second node N2, which is the source electrode of the first transistor ST1, to each other. The third transistor ST3 may be turned on based on the gate signal to supply an initialization voltage to the second node N2. The third transistor ST3 may be turned on based on the gate signal to supply a sensed signal to the initialization voltage line VIL. A gate electrode of the third transistor ST3 may be connected to the gate line GL, a drain electrode of the third transistor ST3 may be connected to the second node N2, and a source electrode of the third transistor ST3 may be connected to the initialization voltage line VIL. The drain electrode of the third transistor ST3 may be connected to the source electrode of the first transistor ST1, a second capacitor electrode of the first capacitor C1, and a drain electrode of the sixth transistor ST6 through the second node N2.

The fourth transistor ST4 may be turned on by a gate signal of the gate line GL to electrically connect the driving voltage line VDDL and the third node N3, which is the drain electrode of the first transistor ST1, to each other. The fourth transistor ST4 may be turned on based on the gate signal to supply a driving voltage or a high potential voltage to the third node N3. A gate electrode of the fourth transistor ST4 may be connected to the gate line GL, a drain electrode of the fourth transistor ST4 may be connected to the driving voltage line VDDL, and a source electrode of the fourth transistor ST4 may be connected to the third node N3. The source electrode of the fourth transistor ST4 may be connected to the drain electrode of the first transistor ST1 and a source electrode of the fifth transistor ST5 through the third node N3.

The fifth transistor ST5 may be turned on by an emission control signal of the emission control line EML to electrically connect the light emitting element ED and the third node N3, which is the drain electrode of the first transistor ST1, to each other. The fifth transistor ST5 may be turned on based on the emission control signal to supply a driving current flowing through the light emitting element ED to the first transistor ST1. A gate electrode of the fifth transistor ST5 may be connected to the emission control line EML, a drain electrode of the fifth transistor ST5 may be connected to a second electrode of a second light emitting element ED2, and the source electrode of the fifth transistor ST5 may be connected to the third node N3. The source electrode of the fifth transistor ST5 may be connected to the drain electrode of the first transistor ST1 and the source electrode of the fourth transistor ST4 through the third node N3.

The sixth transistor ST6 may be turned on by an emission control signal of the emission control line EML to electrically connect the second node N2, which is the source electrode of the first transistor ST1, and the low potential line VSSL to each other. The sixth transistor ST6 may be turned on based on the emission control signal to discharge a voltage of the second node N2 to a low potential voltage. A gate electrode of the sixth transistor ST6 may be connected to the emission control line EML, the drain electrode of the sixth transistor ST6 may be connected to the second node N2, and a source electrode of the sixth transistor ST6 may be connected to the low potential line VSSL. The drain electrode of the sixth transistor ST6 may be connected to the source electrode of the first transistor ST1, the second capacitor electrode of the first capacitor C1, and the drain electrode of the third transistor ST3 through the second node N2.

The first capacitor C1 may be connected between the first node N1 and the second node N2. The first capacitor C1 may maintain (or store) a potential difference between the first node N1 and the second node N2. The first capacitor electrode of the first capacitor C1 may be connected to the gate electrode of the first transistor ST1 and the source electrode of the second transistor ST2 through the first node N1. The second capacitor electrode of the first capacitor C1 may be connected to the source electrode of the first transistor ST1, the drain electrode of the third transistor ST3, and the drain electrode of the sixth transistor ST6 through the second node N2.

The light emitting elements ED may include first and second light emitting elements ED1 and ED2. The first and second light emitting elements ED1 and ED2 may be connected to each other in series. The first and second light emitting elements ED1 and ED2 may receive the driving current to emit light. A light emission amount or luminance of the light emitting element ED may be proportional to a magnitude of the driving current. The light emitting element ED may be an organic light emitting diode including an organic light emitting layer, a quantum dot light emitting diode including a quantum dot light emitting layer, a micro light emitting diode, or an inorganic light emitting diode including an inorganic semiconductor.

A first electrode of the first light emitting element ED1 may be connected to the driving voltage line VDDL, and a second electrode of the first light emitting element ED1 may be connected to a fourth node N4. The first electrode of the first light emitting element ED1 may receive a driving voltage or a high potential voltage from the driving voltage line VDDL. The second electrode of the first light emitting element ED1 may be connected to a first electrode of the second light emitting element ED2 through the fourth node N4.

The first electrode of the second light emitting element ED2 may be connected to the fourth node N4, and the second electrode of the second light emitting element ED2 may be connected to the drain electrode of the fifth transistor ST5.

Figure 17:
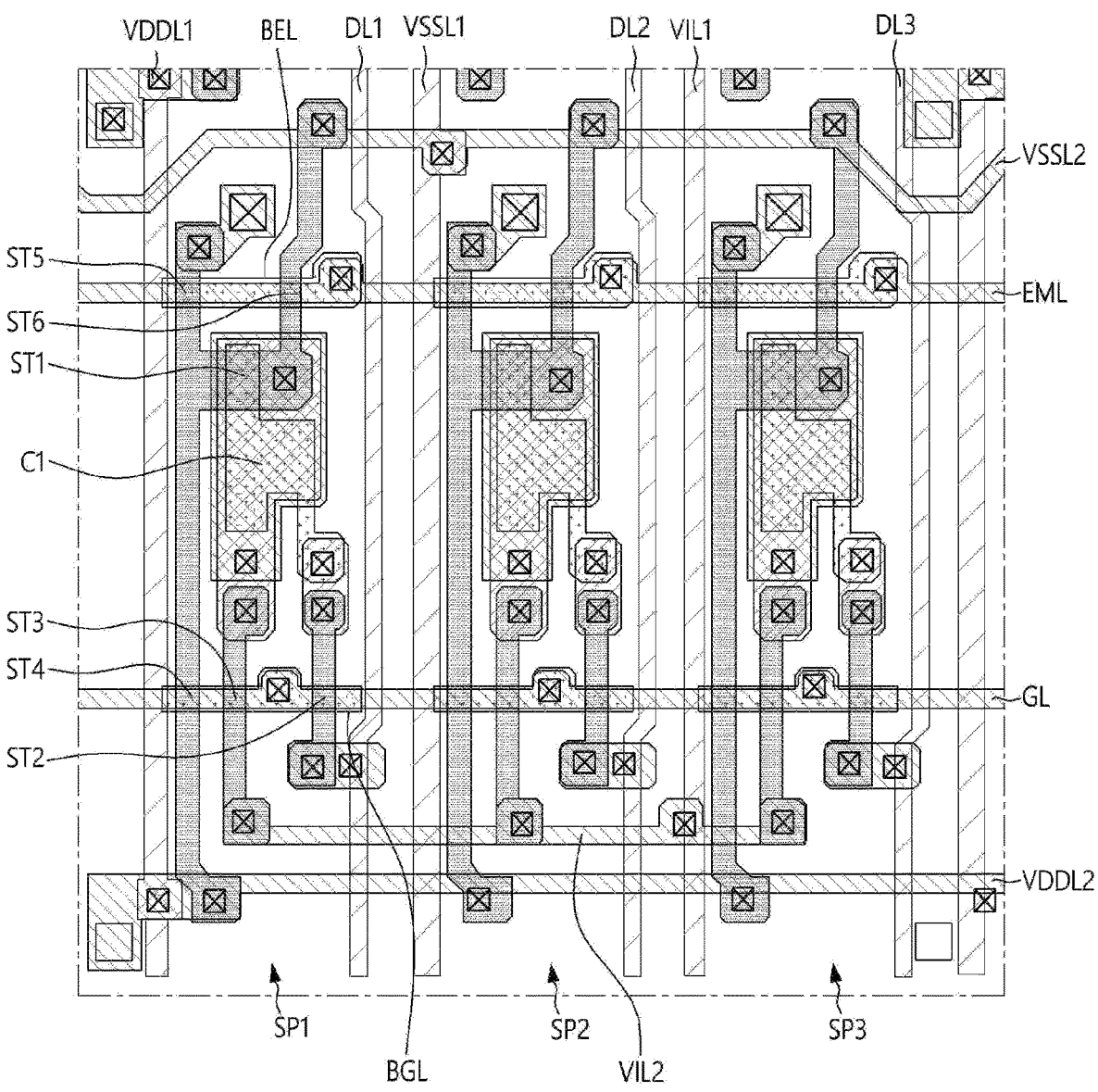
FIG. 17 is a schematic plan view illustrating a thin film transistor layer of the display device of FIG. 16.
Figure 18:
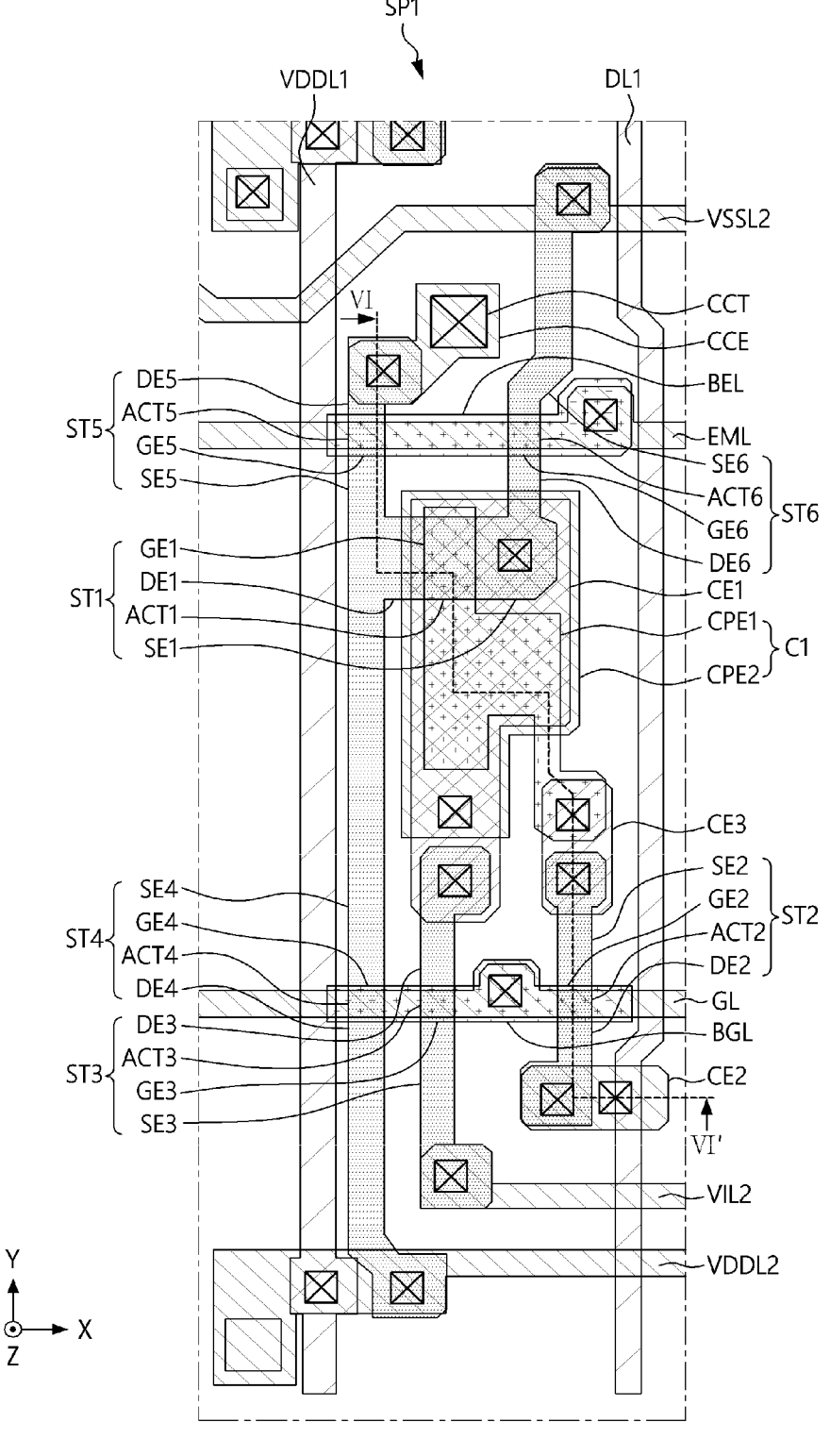
FIG. 18 is a schematic plan view illustrating a first pixel of FIG. 17.
Figure 19:
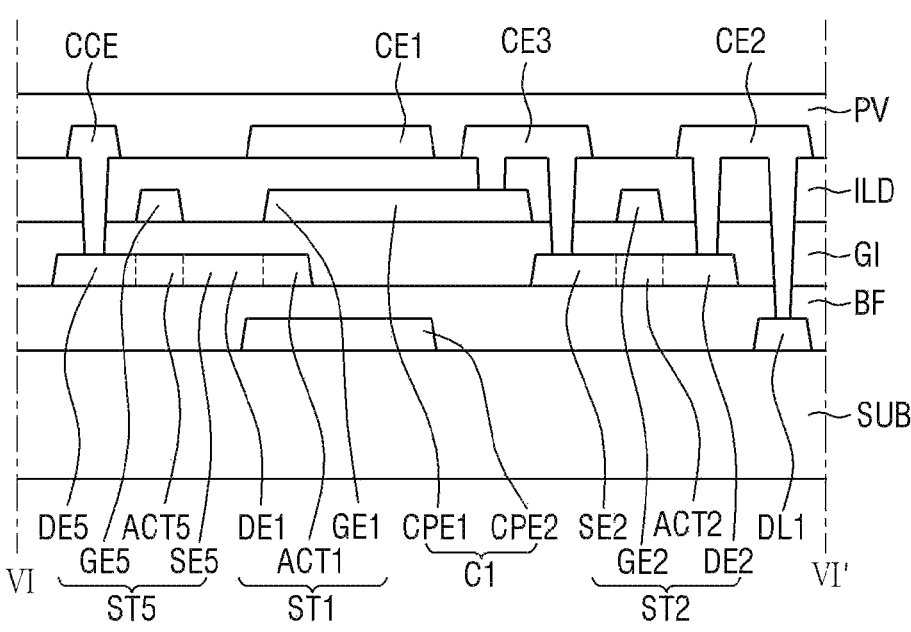
FIG. 19 is a schematic cross-sectional view taken along line VI-VI' of FIG. 18.

FIG. 17 is a schematic plan view illustrating a thin film transistor layer of the display device of FIG. 16, FIG. 18 is a schematic plan view illustrating a first pixel of FIG. 17, and FIG. 19 is a schematic cross-sectional view taken along line VI-VI' of FIG. 18. Pixel circuits of the second and third pixels SP2 and SP3 have the same/similar configuration as a pixel circuit of the first pixel SP1, and a description of the pixel circuits of the second and third pixels SP2 and SP3 will thus be omitted for descriptive convenience.

Referring to FIGS. 17 to 19, the pixels SP may include first to third pixels SP1, SP2, and SP3. Each of the first to third pixels SP1, SP2, and SP3 may include a pixel circuit and a light emitting element ED. The pixel circuit of each of the first to third pixels SP1, SP2, and SP3 may include first to sixth transistors ST1, ST2, ST3, ST4, ST5, and ST6 and a first capacitor C1.

The driving voltage line VDDL may include a first driving voltage line VDDL1 and a second driving voltage line VDDL2. The first driving voltage line VDDL1 may be disposed at (or formed as) the first metal layer MTL1 and extend in the second direction (e.g., Y-axis direction). The first driving voltage line VDDL1 may be disposed on the left side of the pixel circuit of the first pixel SP1. The first driving voltage line VDDL1 may supply a driving voltage or a high potential voltage to the second driving voltage line VDDL2.

The second driving voltage line VDDL2 may be disposed at (or formed as) the third metal layer MTL3 and extend in the first direction (e.g., X-axis direction). The second driving voltage line VDDL2 may be disposed on the lower side of a second initialization voltage line VIL2. The second driving voltage line VDDL2 may be connected to the fourth transistor ST4 of each of the first to third pixels SP1, SP2, and SP3.

The low potential line VSSL may include a first low potential line VSSL1 and a second low potential line VSSL2. The first low potential line VSSL1 may be disposed at (or formed as) the first metal layer MTL1 and extend in the second direction (e.g., Y-axis direction). The first low potential line VSSL1 may be disposed on the left side of the pixel circuit of the second pixel SP2. The first low potential line VSSL1 may supply a low potential voltage to the second low potential line VSSL2.

The second low potential line VSSL2 may be disposed at (or formed as) the third metal layer MTL3 and extend in the first direction (e.g., X-axis direction). The second low potential line VSSL2 may be disposed on the upper side of the pixel circuits of the first to third pixels SP1, SP2, and SP3.

The second low potential line VSSL2 may be connected to the sixth transistor ST6 of each of the first to third pixels SP1, SP2, and SP3.

The initialization voltage line VIL may include a first initialization voltage line VIL1 and the second initialization voltage line VIL2. The first initialization voltage line VIL1 may be disposed at (or formed as) the first metal layer MTL1 and extend in the second direction (e.g., Y-axis direction). The first initialization voltage line VIL1 may be disposed on the left side of the pixel circuit of the third pixel SP3. The first initialization voltage line VIL1 may supply an initialization voltage to the second initialization voltage line VIL2.

The second initialization voltage line VIL2 may be disposed at (or formed as) the third metal layer MTL3 and extend in the first direction (e.g., X-axis direction). The second initialization voltage line VIL2 may be disposed on the lower side of the pixel circuits of the first to third pixels SP1, SP2, and SP3. The second initialization voltage line VIL2 may be connected to the third transistor ST3 of each of the first to third pixels SP1, SP2, and SP3.

The data line DL may include first to third data lines DL1, DL2, and DL3. The first to third data lines DL1, DL2, and DL3 may extend in the second direction (e.g., Y-axis direction). The first data line DL1 may be disposed on the right side of the pixel circuit of the first pixel SP1 and supply a data voltage to the pixel circuit of the first pixel SP1. The second data line DL2 may be disposed on the right side of the pixel circuit of the second pixel SP2 and supply a data voltage to the pixel circuit of the second pixel SP2. The third data line DL3 may be disposed on the right side of the pixel circuit of the third pixel SP3 and supply a data voltage to the pixel circuit of the third pixel SP3. Each of the first to third data lines DL1, DL2, and DL3 may be connected to the second transistor ST2 of each of the first to third pixels SP1, SP2, and SP3.

The first transistor ST1 may include an active region ACT1, a gate electrode GE1, a drain electrode DE1, and a source electrode SE1. The active region ACT1, the drain electrode DE1, and the source electrode SE1 of the first transistor ST1 may be disposed at (or formed as) the active layer ACTL, and the gate electrode GE1 of the first transistor ST1 may be disposed at (or formed as) the second metal layer MTL2. The gate electrode GE1 of the first transistor ST1 may be a portion of a first capacitor electrode CPE1 of the second metal layer MTL2 and may overlap the active region ACT1 of the first transistor ST1.

The gate electrode GE1 of the first transistor ST1 may be electrically connected to a source electrode SE2 of the second transistor ST2 through a third connection electrode CE3 of the third metal layer MTL3. The drain electrode DE1 of the first transistor ST1 may be connected to a source electrode SE4 of the fourth transistor ST4 and a source electrode SE5 of the fifth transistor ST5. The source electrode SE1 of the first transistor ST1 may be connected to a drain electrode DE6 of the sixth transistor ST6. The source electrode SE1 of the first transistor ST1 may be electrically connected to a drain electrode DE3 of the third transistor ST3 through a first connection electrode CE1 disposed at (or formed as) the third metal layer MTL3.

The first connection electrode CE1 may be connected to a second capacitor electrode CPE2 disposed at (or formed as) the first metal layer MTL1. Accordingly, the first capacitor C1 may be doubly formed between the first capacitor electrode CPE1 and the second capacitor electrode CPE2 and between the first capacitor electrode CPE1 and the first connection electrode CE1.

The second transistor ST2 may include an active region ACT2, a gate electrode GE2, a drain electrode DE2, and the source electrode SE2. The active region ACT2, the drain electrode DE2, and the source electrode SE2 of the second transistor ST2 may be disposed at (or formed as) the active layer ACTL, and the gate electrode GE2 of the second transistor ST2 may be disposed at (or formed as) the second metal layer MTL2. The gate electrode GE2 of the second transistor ST2 may be a portion of an auxiliary gate line BGL of the second metal layer MTL2 and may overlap the active region ACT2 of the second transistor ST2. The auxiliary gate line BGL may be connected to the gate line GL of the third metal layer MTL3 to receive a gate signal.

The drain electrode DE2 of the second transistor ST2 may be electrically connected to the first data line DL1 of the first metal layer MTL1 through a second connection electrode CE2 of the third metal layer MTL3. The drain electrode DE2 of the second transistor ST2 may receive a data voltage of the first pixel SP1 from the first data line DL1.

The source electrode SE2 of the second transistor ST2 may be electrically connected to the gate electrode GE1 of the first transistor ST1 through the third connection electrode CE3.

The third transistor ST3 may include an active region ACT3, a gate electrode GE3, the drain electrode DE3, and a source electrode SE3. The active region ACT3, the drain electrode DE3, and the source electrode SE3 of the third transistor ST3 may be disposed at (or formed as) the active layer ACTL, and the gate electrode GE3 of the third transistor ST3 may be disposed at (or formed as) the second metal layer MTL2. The gate electrode GE3 of the third transistor ST3 may be a portion of the auxiliary gate line BGL of the second metal layer MTL2 and may overlap the active region ACT3 of the third transistor ST3.

The drain electrode DE3 of the third transistor ST3 may be electrically connected to the source electrode SE1 of the first transistor ST1 through the first connection electrode CE1 of the third metal layer MTL3. The source electrode SE3 of the third transistor ST3 may be connected to the second initialization voltage line VIL2 of the third metal layer MTL3. The source electrode SE3 of the third transistor ST3 may receive an initialization voltage from the second initialization voltage line VIL2.

The fourth transistor ST4 may include an active region ACT4, a gate electrode GE4, a drain electrode DE4, and the source electrode SE4. The active region ACT4, the drain electrode DE4, and the source electrode SE4 of the fourth transistor ST4 may be disposed at (or formed as) the active layer ACTL, and the gate electrode GE4 of the fourth transistor ST4 may be disposed at (or formed as) the second metal layer MTL2. The gate electrode GE4 of the fourth transistor ST4 may be a portion of the auxiliary gate line BGL of the second metal layer MTL2 and may overlap the active region ACT4 of the fourth transistor ST4.

The drain electrode DE4 of the fourth transistor ST4 may be connected to the second driving voltage line VDDL2 of the third metal layer MTL3. The source electrode SE4 of the fourth transistor ST4 may be connected to the drain electrode DE1 of the first transistor ST1 and the source electrode SE5 of the fifth transistor ST5.

The fifth transistor ST5 may include an active region ACT5, a gate electrode GE5, a drain electrode DE5, and the source electrode SE5. The active region ACT5, the drain electrode DE5, and the source electrode SE5 of the fifth transistor ST5 may be disposed at (or formed as) the active layer ACTL, and the gate electrode GE5 of the fifth transistor ST5 may be disposed at (or formed as) the second metal layer MTL2. The gate electrode GE5 of the fifth transistor ST5 may be a portion of an auxiliary emission control line BEL of the second metal layer MTL2 and may overlap the active region ACT5 of the fifth transistor ST5.

The drain electrode DE5 of the fifth transistor ST5 may be electrically connected to the light emitting element ED through a cathode connection electrode CCE of the third metal layer MTL3. The drain electrode DE5 of the fifth transistor ST5 may receive the driving current flowing through the light emitting element ED. The source electrode SE5 of the fifth transistor ST5 may be connected to the drain electrode DE1 of the first transistor ST1 and the source electrode SE4 of the fourth transistor ST4.

The sixth transistor ST6 may include an active region ACT6, a gate electrode GE6, the drain electrode DE6, and a source electrode SE6. The active region ACT6, the drain electrode DE6, and the source electrode SE6 of the sixth transistor ST6 may be disposed at (or formed as) the active layer ACTL, and the gate electrode GE6 of the sixth transistor ST6 may be disposed at (or formed as) the second metal layer MTL2. The gate electrode GE6 of the sixth transistor ST6 may be a portion of the auxiliary emission control line BEL of the second metal layer MTL2 and may overlap the active region ACT6 of the sixth transistor ST6.

The drain electrode DE6 of the sixth transistor ST6 may be connected to the source electrode SE1 of the first transistor ST1. The source electrode SE6 of the sixth transistor ST6 may be connected to the second low potential line VSSL2 of the third metal layer MTL3. The source electrode SE6 of the sixth transistor ST6 may receive a low potential voltage from the second low potential line VSSL2.

Figure 20:
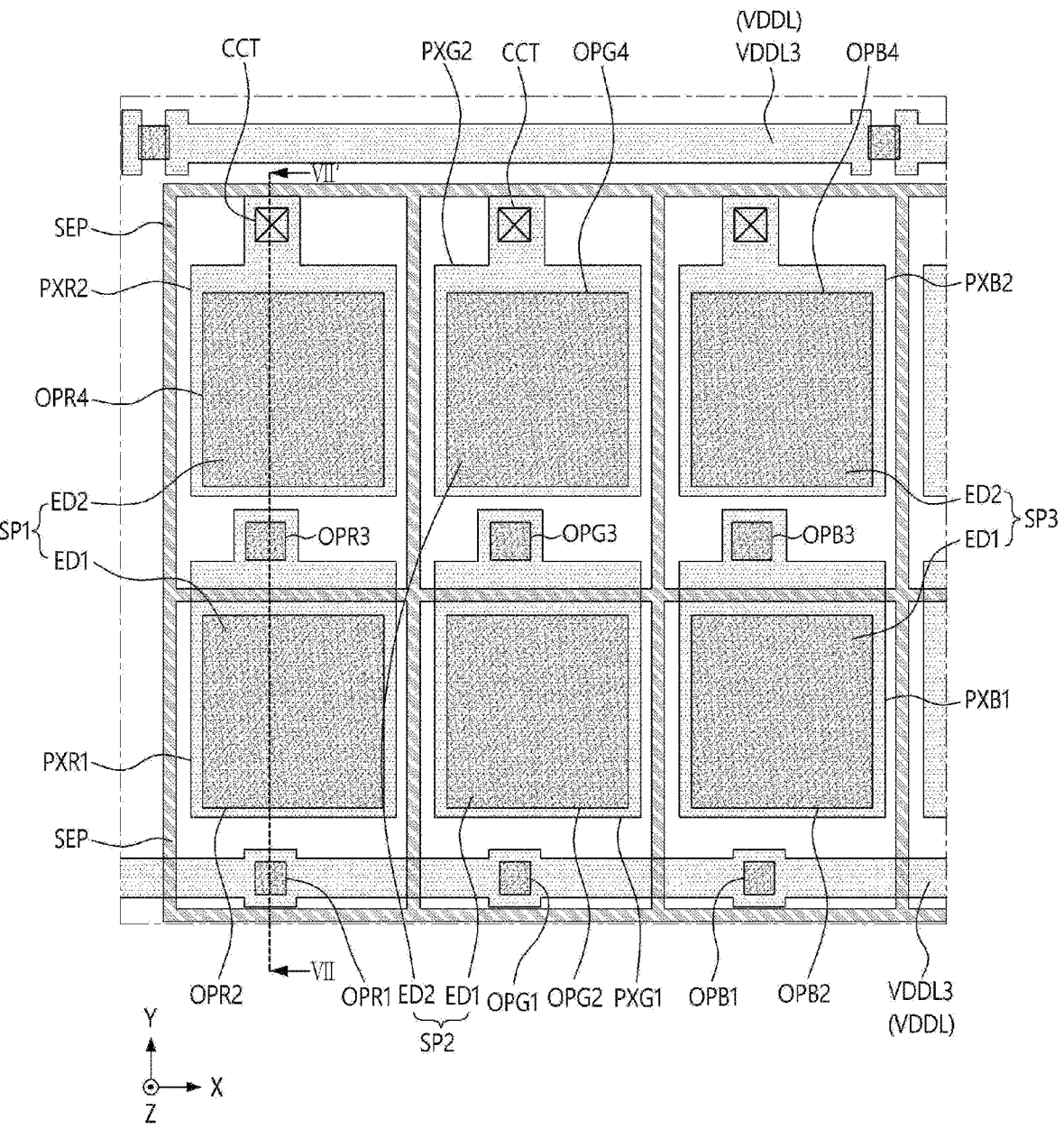
FIG. 20 is a schematic plan view illustrating a light emitting element layer of a display device according to still another embodiment.
Figure 21:
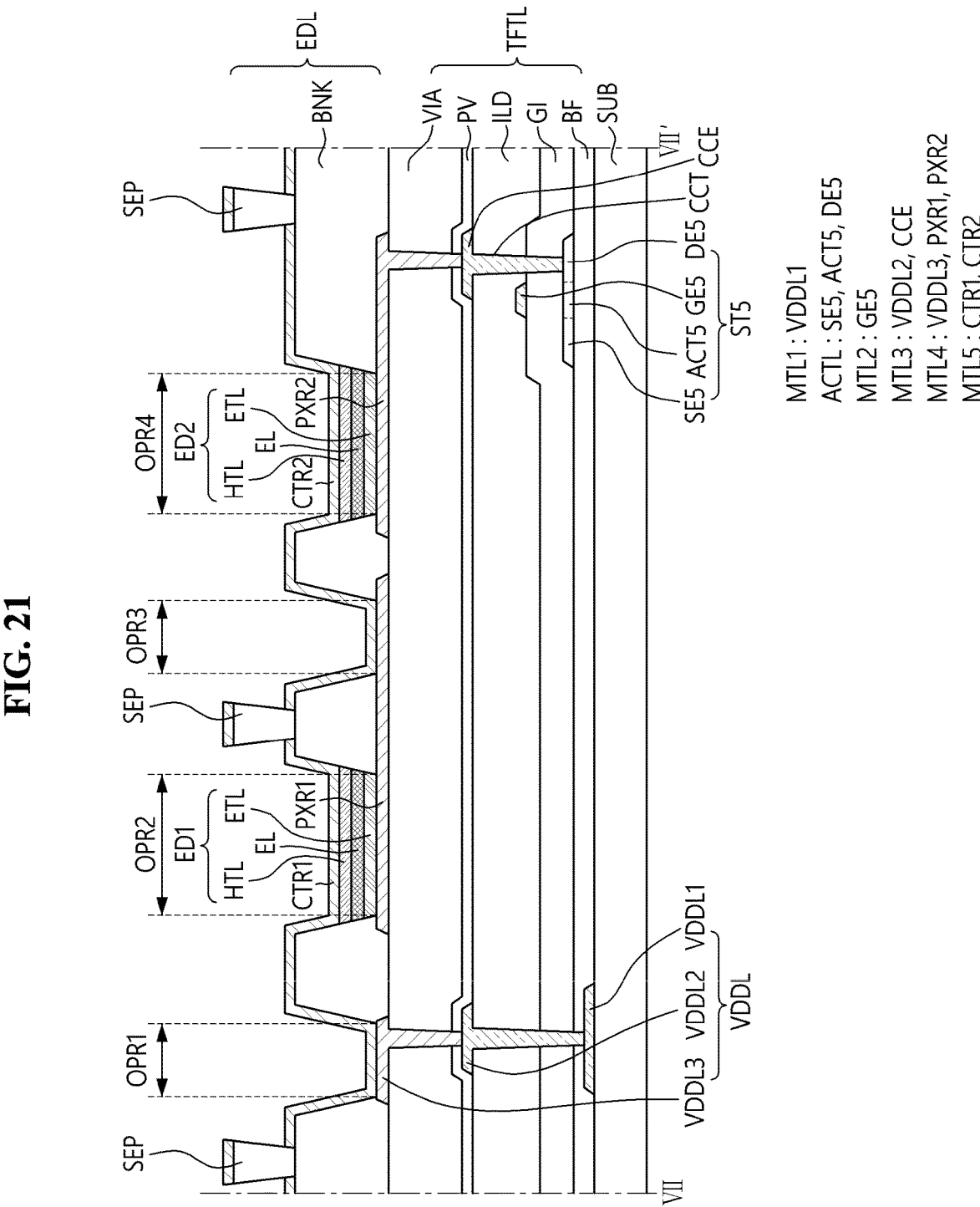
FIG. 21 is a schematic cross-sectional view taken along line VII-VII' of FIG. 20.

FIG. 20 is a schematic plan view illustrating a light emitting element layer of a display device according to still another embodiment, and FIG. 21 is a schematic cross-sectional view taken along line VII-VII' of FIG. 20.

Referring to FIGS. 20 and 21, a light emitting element layer EDL may be disposed on a thin film transistor layer TFTL. The light emitting element layer EDL may include a fourth metal layer MTL4, a bank BNK, an electron transport layer ETL, a light emitting layer EL, a hole transport layer HTL, a separation part SEP, and a fifth metal layer MTL5.

The fourth metal layer MTL4 may be disposed on the via layer VIA of the thin film transistor layer TFTL. The fourth metal layer MTL4 may include a third driving voltage line VDDL3, a first pixel electrode PXR1 and a second pixel electrode PXR2 of the first pixel SP1, a first pixel electrode PXG1 and a second pixel electrode PXG2 of the second pixel SP2, and a first pixel electrode PXB1 and a second pixel electrode PXB2 of the third pixel SP3.

The bank BNK may be disposed on the via layer VIA of the thin film transistor layer TFTL and the fourth metal layer MTL4. The bank BNK may electrically insulate the fourth metal layer MTL4. The bank BNK may include a plurality of open parts. The fourth metal layer MTL4 and the fifth metal layer MTL5 may be in contact with each other through some of the plurality of open parts, and the others of the plurality of open parts may correspond to emission areas in which the light emitting elements ED are disposed.

The separation part SEP may be disposed on an upper surface of the bank BNK. The fifth metal layer MTL5 may be formed on the entire surface of the display area DA by a single process and may be separated by the separation part SEP. The separation part SEP may surround a first open part OPR1 and a second open part OPR2 of the first pixel SP1. The separation part SEP may surround a third open part OPR3 and a fourth open part OPR4 of the first pixel SP1. The separation part SEP may surround a first open part OPG1 and a second open part OPG2 of the second pixel SP2. The separation part SEP may surround a third open part OPG3 and a fourth open part OPG4 of the second pixel SP2. The separation part SEP may surround a first open part OPB1 and a second open part OPB2 of the third pixel SP3. The separation part SEP may surround a third open part OPB3 and a fourth open part OPB4 of the third pixel SP3.

For example, the separation part SEP may separate a first contact electrode CTR1 and a second contact electrode CTR2 of the first pixel SP1, a first contact electrode and a second contact electrode of the second pixel SP2, and a first contact electrode and a second contact electrode of the third pixel SP3 from each other.

The fifth metal layer MTL5 may be disposed on the fourth metal layer MTL4, the hole transport layer HTL, the bank BNK, and the separation part SEP. The fifth metal layer MTL5 may include the first contact electrode CTR1 and the second contact electrode CTR2 of the first pixel SP1, the first contact electrode and the second contact electrode of the second pixel SP2, and the first contact electrode and the second contact electrode of the third pixel SP3.

The driving voltage line VDDL may include a first driving voltage line VDDL1, a second driving voltage line VDDL2, and the third driving voltage line VDDL3. The third driving voltage line VDDL3 may be disposed at (or formed as) the fourth metal layer MTL4 and extend in the first direction (e.g., X-axis direction). The third driving voltage line VDDL3 may overlap the first open part OPR1 of the first pixel SP1, the first open part OPG1 of the second pixel SP2, and the first open part OPB1 of the third pixel SP3. The third driving voltage line VDDL3 may receive a driving voltage or a high potential voltage from the second driving voltage line VDDL2 disposed at (or formed as) the third metal layer MTL3 and the first driving voltage line VDDL1 disposed at (or formed as) the first metal layer MTL1. The third driving voltage line VDDL3 may be connected to the first contact electrode CTR1 of the first pixel SP1 through the first open part OPR1 of the first pixel SP1.

The first contact electrode CTR1 of the first pixel SP1 may be disposed on the first open part OPR1 and the second open part OPR2 of the first pixel SP1. The first contact electrode CTR1 may correspond to a first electrode of the first light emitting element ED1.

The first light emitting element ED1 of the first pixel SP1 may be disposed in the second open part OPR2 of the first pixel SP1. The first light emitting element ED1 may include the first electrode, a hole transport layer HTL, a light emitting layer EL, an electron transport layer ETL, and a second electrode. The first electrode of the first light emitting element ED1 may be the first contact electrode CTR1, and the second electrode of the first light emitting element ED1 may be the first pixel electrode PXR1. Accordingly, the first contact electrode CTR1 may be an anode electrode of the first light emitting element ED1, and the first pixel electrode PXR1 may be a cathode electrode of the first light emitting element ED1.

The electron transport layer ETL of the first light emitting element ED1 may be disposed on the first pixel electrode PXR1, and the light emitting layer EL of the first light emitting element ED1 may be disposed on the electron transport layer ETL. The hole transport layer HTL may be disposed on the light emitting layer EL, and the first contact electrode CTR1 may be disposed on the hole transport layer HTL. For example, the light emitting layer EL may be an organic light emitting layer including an organic material. In case that the first contact electrode CTR1 receives the driving voltage through the driving voltage line VDDL, holes may move to the light emitting layer EL through the hole transport layer HTL and electrons may move to the light emitting layer EL through the electron transport layer ETL. The holes and the electrons may be combined with each other in the light emitting layer EL to emit light.

The first pixel electrode PXR1 of the first pixel SP1 may overlap the second open part OPR2 and the third open part OPR3 of the first pixel SP1. The second open part OPR2 and the third open part OPR3 may be spaced apart from each other with the separation part SEP interposed between the second open part OPR2 and the third open part OPR3. The first pixel electrode PXR1 of the first pixel SP1 may correspond to the second electrode of the first light emitting element ED1, and may be connected to the second contact electrode CTR2 of the first pixel SP1 through the third open part OPR3.

The second contact electrode CTR2 of the first pixel SP1 may be disposed on the third open part OPR3 and the fourth open part OPR4 of the first pixel SP1. The second contact electrode CTR2 may correspond to a first electrode of the second light emitting element ED2.

The second light emitting element ED2 of the first pixel SP1 may be disposed in the fourth open part OPR4 of the first pixel SP1. The second light emitting element ED2 may include the first electrode, a hole transport layer HTL, a light emitting layer EL, an electron transport layer ETL, and a second electrode. The first electrode of the second light emitting element ED2 may be the second contact electrode CTR2, and the second electrode of the second light emitting element ED2 may be the second pixel electrode PXR2. Accordingly, the second contact electrode CTR2 may be an anode electrode of the second light emitting element ED2, and the second pixel electrode PXR2 may be a cathode electrode of the second light emitting element ED2.

The electron transport layer ETL of the second light emitting element ED2 may be disposed on the second pixel electrode PXR2, and the light emitting layer EL of the second light emitting element ED2 may be disposed on the electron transport layer ETL. The hole transport layer HTL may be disposed on the light emitting layer EL, and the second contact electrode CTR2 may be disposed on the hole transport layer HTL. For example, the light emitting layer EL may be an organic light emitting layer including an organic material. In case that the second contact electrode CTR2 receives the driving current flowing through the first light emitting element ED1, holes may move to the light emitting layer EL through the hole transport layer HTL and electrons may move to the light emitting layer EL through the electron transport layer ETL. The holes and the electrons may be combined with each other in the light emitting layer EL to emit light.

The second pixel electrode PXR2 may be electrically connected to the pixel circuit of the first pixel SP1 through the cathode connection electrode CCE of the third metal layer MTL3. The driving current flowing through the first and second light emitting elements ED1 and ED2 may be supplied to the fifth transistor ST5 of the first pixel SP1 through the cathode connection electrode CCE.

The display device 10 may increase luminous efficiency and decrease a magnitude of the driving current as compared with a case where one light emitting element is included by supplying the driving current of the first pixel SP1 to the first and second light emitting elements ED1 and ED2 disposed at/on (or formed as) the same layer and connected to each other in series. Accordingly, the display device 10 may decrease power consumption.

The first and second light emitting elements ED1 and ED2 of each of the second and third pixels SP2 and SP3 may be formed in the same manner as the first and second light emitting elements ED1 and ED2 of the first pixel SP1 illustrated in FIG. 21.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a pixel circuit disposed on a substrate and including at least one transistor;
a first pixel electrode disposed on the pixel circuit and electrically connected to the pixel circuit;
a bank disposed on the first pixel electrode and including first, second, third and fourth open parts;
a first contact electrode disposed on the bank and the first and second open parts, the first contact electrode being in contact with the first pixel electrode through the first open part;
a second pixel electrode overlapping the second and third open parts, the second pixel electrode and the first pixel electrode formed as a same layer;
a second contact electrode disposed on the bank and the third and fourth open parts, the second contact electrode being in contact with the second pixel electrode through the third open part; and
a common pixel electrode overlapping the fourth open part, the common pixel electrode and the second pixel electrode formed as a same layer.

2. The display device of claim 1, further comprising:
a first light emitting element comprising:
a first electrode corresponding to the first contact electrode, and
a second electrode corresponding to the second pixel electrode; and
a second light emitting element comprising:
a first electrode corresponding to the second contact electrode, and
a second electrode corresponding to the common pixel electrode.

3. The display device of claim 2, wherein the first light emitting element further comprises:
an electron transport layer disposed on the second pixel electrode;
a light emitting layer disposed on the electron transport layer; and
a hole transport layer disposed between the light emitting layer and the first contact electrode.

4. The display device of claim 2, wherein the second light emitting element further comprises:
an electron transport layer disposed on the common pixel electrode;
a light emitting layer disposed on the electron transport layer; and
a hole transport layer disposed between the light emitting layer and the second contact electrode.

5. The display device of claim 2, further comprising a separation part disposed on the bank and separating the first and second contact electrodes from each other.

6. The display device of claim 1, further comprising:
a first voltage line supplying a high potential voltage;
a data line supplying a data voltage; and an initialization voltage line supplying an initialization voltage, wherein the pixel circuit comprises:

a first transistor electrically connecting the first voltage line and the first pixel electrode to each other based on a voltage of a first node;

a second transistor electrically connecting the data line and a gate electrode of the first transistor to each other based on a first gate signal; and a third transistor electrically connecting the initialization voltage line and the first pixel electrode to each other based on a second gate signal different from the first gate signal.

7. The display device of claim 6, further comprising:

a vertical voltage line supplying a low potential voltage, wherein the common pixel electrode is electrically connected to the vertical voltage line.

8. A display device comprising:

a pixel circuit disposed on a substrate and including at least one transistor;

a first pixel electrode disposed on the pixel circuit and electrically connected to the pixel circuit;

a bank disposed on the first pixel electrode and including first, second, and third open parts and a power open part;

a contact electrode disposed on the bank and the first and second open parts;

a second pixel electrode overlapping the second and third open parts and being in contact with the contact electrode through the second open part, the second pixel electrode and the first pixel electrode formed as a same layer;

a common cathode electrode disposed on the bank, the third open part, and the power open part; and a common pixel electrode overlapping the power open part and being in contact with the common cathode electrode through the power open part, the common pixel electrode and the second pixel electrode formed as a same layer.

9. The display device of claim 8, further comprising:

a first light emitting element comprising:

a first electrode corresponding to the first pixel electrode, and a second electrode corresponding to the contact electrode; and a second light emitting element comprising:

a first electrode corresponding to the second pixel electrode, and a second electrode corresponding to the common cathode electrode.

10. The display device of claim 9, wherein the first light emitting element further comprises:

a hole transport layer disposed on the first pixel electrode;

a light emitting layer disposed on the hole transport layer; and an electron transport layer disposed between the light emitting layer and the contact electrode.

11. The display device of claim 9, wherein the second light emitting element further comprises:

a hole transport layer disposed on the second pixel electrode;

a light emitting layer disposed on the hole transport layer; and an electron transport layer disposed between the light emitting layer and the common cathode electrode.

12. The display device of claim 9, further comprising a separation part disposed on the bank and separating the contact electrode and the common cathode electrode from each other.

13. The display device of claim 8, further comprising:

a vertical voltage line supplying a low potential voltage, wherein the common pixel electrode is electrically connected to the vertical voltage line.

14. A display device comprising:

a pixel circuit disposed on a substrate and including at least one transistor;

a driving voltage line disposed on the pixel circuit and supplying a high potential voltage;

a bank disposed on the driving voltage line and including first, second, third, and fourth open parts;

a first contact electrode disposed on the bank and the first and second open parts, the first contact electrode being in contact with the driving voltage line through the first open part;

a first pixel electrode overlapping the second and third open parts, the first pixel electrode and the driving voltage line formed as a same layer;

a second contact electrode disposed on the bank and the third and fourth open parts, the second contact electrode being in contact with the first pixel electrode through the third open part; and a second pixel electrode overlapping the fourth open part, the second pixel electrode and the first pixel electrode formed as a same layer.

15. The display device of claim 14, further comprising:

a first light emitting element comprising:

a first electrode corresponding to the first contact electrode, and a second electrode corresponding to the first pixel electrode; and a second light emitting element comprising:

a first electrode corresponding to the second contact electrode, and a second electrode corresponding to the second pixel electrode.

16. The display device of claim 15, wherein the first light emitting element further comprises:

an electron transport layer disposed on the first pixel electrode;

a light emitting layer disposed on the electron transport layer; and a hole transport layer disposed between the light emitting layer and the first contact electrode.

17. The display device of claim 15, wherein the second light emitting element further comprises:

an electron transport layer disposed on the second pixel electrode;

a light emitting layer disposed on the electron transport layer; and a hole transport layer disposed between the light emitting layer and the second contact electrode.

18. The display device of claim 15, further comprising a separation part disposed on the bank and separating the first and second contact electrodes from each other.

19. The display device of claim 15, further comprising:

a data line supplying a data voltage;

an initialization voltage line supplying an initialization voltage; and a low potential line supplying a low potential voltage;

wherein the pixel circuit comprises:

a first transistor controlling a driving current based on a voltage of a first node;

a second transistor electrically connecting the data line and a gate electrode of the first transistor to each other based on a gate signal;

a third transistor electrically connecting the initialization voltage line and a source electrode of the first transistor to each other based on the gate signal;

a fourth transistor electrically connecting the driving voltage line and a drain electrode of the first transistor to each other based on the gate signal;

a fifth transistor electrically connecting the second electrode of the second light emitting element and the drain electrode of the first transistor to each other based on an emission control signal; and a sixth transistor electrically connecting the source electrode of the first transistor and the low potential line to each other based on the emission control signal.

20. The display device of claim 19, wherein the second pixel electrode is electrically connected to a drain electrode of the fifth transistor.

\* \* \* \* \*